United States Patent
Degawa et al.

(10) Patent No.: US 8,891,208 B2
(45) Date of Patent: Nov. 18, 2014

(54) CPP-TYPE MAGNETORESISTIVE ELEMENT INCLUDING A REAR BIAS STRUCTURE AND LOWER SHIELDS WITH INCLINED MAGNETIZATIONS

(71) Applicant: TDK Corporation, Tokyo (JP)

(72) Inventors: Naomichi Degawa, Tokyo (JP); Takahiko Machita, Tokyo (JP); Takekazu Yamane, Tokyo (JP); Takumi Yanagisawa, Tokyo (JP); Satoshi Miura, Tokyo (JP); Kenta Hamamoto, Tokyo (JP); Minoru Ota, Tokyo (JP); Kenzo Makino, Tokyo (JP); Shohei Kawasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/853,927

(22) Filed: Mar. 29, 2013

(65) Prior Publication Data
US 2014/0293475 A1 Oct. 2, 2014

(51) Int. Cl.
*G11B 5/39* (2006.01)
*H01L 43/08* (2006.01)

(52) U.S. Cl.
CPC .............. *G11B 5/3932* (2013.01); *H01L 43/08* (2013.01)
USPC ..................................... 360/319; 360/324.12

(58) Field of Classification Search
USPC .......... 360/319, 324.1, 324.11, 324.12, 324.2
See application file for complete search history.

(56) References Cited

U.S. PATENT DOCUMENTS

| | | | |
|---|---|---|---|
| 8,144,437 B2 | 3/2012 | Miyauchi et al. | |
| 8,422,177 B2 * | 4/2013 | Fernandez-de-Castro | ... 360/319 |
| 8,477,461 B2 * | 7/2013 | Chou et al. | ..................... 360/319 |
| 8,514,525 B2 * | 8/2013 | Childress et al. | ............. 360/319 |
| 8,559,140 B2 * | 10/2013 | Gao | ......................... 360/324.12 |
| 2006/0209469 A1 * | 9/2006 | Akimoto | ....................... 360/319 |
| 2009/0073616 A1 | 3/2009 | Shimazawa et al. | |
| 2009/0135529 A1 | 5/2009 | Shimazawa et al. | |
| 2010/0079917 A1 * | 4/2010 | Miyauchi et al. | ............. 360/319 |
| 2011/0228428 A1 | 9/2011 | Dimitrov et al. | |

* cited by examiner

*Primary Examiner* — Jefferson Evans
(74) *Attorney, Agent, or Firm* — Posz Law Group, PLC

(57) ABSTRACT

An MR element suppressing a false writing into a medium with an MR part has a CPP structure. The MR part includes a nonmagnetic intermediate layer and first and second ferromagnetic layers so as to interpose the nonmagnetic intermediate layer. First and second shield layers respectively have an inclining magnetization structure of which a magnetization is inclined with regard to a track width direction. The first and second ferromagnetic layers are respectively, magnetically coupled with the first and second shield layers. A magnetization direction adjustment layer for adjusting at least a magnetization direction of the first ferromagnetic layer is positioned at a rear end surface side of the first ferromagnetic layer, which is opposite to a front end surface receiving a magnetic field detected in the MR part.

20 Claims, 17 Drawing Sheets

CPP-TYPE MAGNETORESISTIVE ELEMENT INCLUDING A REAR BIAS STRUCTURE AND LOWER SHIELDS WITH INCLINED MAGNETIZATIONS

BACKGROUND OF THE INVENTION

1. Field of the Invention

The present invention relates to a magnetoresistive effect element (MR element) for reading the intensity of a magnetic field, such as a magnetic recording medium, as a signal, a head gimbal assembly (HGA) including the thin film magnetic head, and a magnetic disk apparatus.

2. Description of the Related Art

Recently, in association with high recording density, improvement of performance in the thin film magnetic head is in demand. As the thin film magnetic head, a composite type thin film magnetic head with a structure where a reproducing head having a magnetoresistive (MR) effect element that is exclusively for reading and a recording head having an induction-type magnetic transduction element that is exclusively for writing are laminated is widely used.

At present, as the reproducing head, an MR element with a so-called current-in-plane (CIP) structure that is operated by applying an electric current in parallel with a film surface of the element, referred to as a spin valve GMR element, is widely used. The spin valve GMR element with such structure is positioned between upper and lower shield layers made of a soft magnetic metal film, and, is arranged in a form interposed by insulating layers referred to as gap layers from upper and lower sides. Recording density in a bit direction is determined by a space (reproducing gap space) of the upper and lower shield layers.

In association with increase of the recording density, for the reproducing element of the reproducing head, demand for a narrower shield gap or a narrower truck is stronger. Because of the narrower track of the reproducing element and shortening of element height in association with the narrowing, an area of the element is decreased, but since a heat dissipation efficiency is reduced with the conventional structure in association with the decrease in the area, there is a problem that an operating current is restricted from a viewpoint of reliability.

In order to resolve such problem, the upper and lower shield layers (first shield layer and second shield layer) and the MR element are electrically connected in series, and the GMR element (CPP-GMR element) with a current-magnetoresistive-effect element (CPP) structure not requiring the insulating layer between the shields is proposed, and this is considered as an essential technology to accomplish the recording density exceeding 200 Gbits/in$^2$.

Such CPP-GMR element has a lamination structure including a first ferromagnetic layer and a second ferromagnetic layer formed so as to interpose a conductive nonmagnetic intermediate layer from both sides. The lamination structure of a typical spin valve type CPP-GMR element is a lamination structure where a lower electrode/an antiferromagnetic layer/a lower ferromagnetic layer/a conductive nonmagnetic intermediate layer/an upper ferromagnetic layer/an upper electrode are laminated in respective order from the substrate side.

A magnetization direction of the lower ferromagnetic layer, which is one of the ferromagnetic layers, is secured to be perpendicular to the magnetization direction of the upper ferromagnetic layer when an external application magnetic field is zero. The magnetization direction of the lower ferromagnetic layer is secured by adjoining the antiferromagnetic layer, and by giving unidirectional anisotropy energy (also referred to as "exchange bias" or "coupling magnetic field") to the lower ferromagnetic layer due to exchange coupling between the antiferromagnetic layer and the lower ferromagnetic layer. Consequently, the lower ferromagnetic layer is also referred to as a magnetization pinned layer. In the meantime, the upper ferromagnetic layer is also referred to as a free layer.

In addition, it is also proposed that a three-layer structure (a so-called "synthetic ferromagnetic (SyF) structure" or "synthetic pinned structure") with a ferromagnetic layer/a nonmagnetic metal layer/a ferromagnetic layer is adopted to the magnetization pinned layer (lower ferromagnetic layer). This structure enables to provide strong exchange coupling between the two ferromagnetic layers constituting the magnetization pinned layer (lower ferromagnetic layer), and to effectively increase the exchange-coupling force from the antiferromagnetic layer, and further enables to decrease the effect of a static magnetic field to be generated from the magnetization pinned layer on the free layer, as well. Consequently, this "synthetic pinned structure" is widely used at present.

However, in order to respond to the recent demand for the super high recording density, further reduction of thickness of the MR element is required. Under such circumstances, for example, a new GMR element structure having a simple three-layer lamination structure with a ferromagnetic layer/a nonmagnetic intermediate layer/a ferromagnetic layer as disclosed in U.S. Pat. No. 7,019,371B2 and U.S. Pat. No. 7,035,062B1, as a basic structure, is proposed. In this GMR element structure, as shown in FIG. 21, two ferromagnetic layers 61 and 62 are exchange-coupled so as to have their magnetizations 61a and 62a to be antiparallel with each other. Then, a permanent magnet HM is arranged at a depth position, which is opposite from ABS that is equivalent to a recording medium opposition surface of the element, and an initial state where the magnetizations 61a and 62a of the two ferromagnetic layers 61 and 62 are inclined with regard to their track width directions by approximately 45 degrees by a bias magnetic field to be generated from the permanent magnet HM and are substantially at right angles, respectively (see FIG. 22). If the element in this initial magnetization state detects a signal magnetic field from a medium, the magnetization directions of the two ferromagnetic layers 61 and 62 are changed as if the operation of cutting paper with scissors, and as a result, a resistance value of the element is changed. Furthermore, such element structure is referred to as a dual free layer (DFL) element structure in the present specification as a matter of convenience.

When this DFL element structure is applied to the TMR element or the CPP-GMR element, it becomes possible to further narrow "read gap", which is a space between first and the second shield layers 71 and 72, compared to the general spin valve type CPP-GMR element. Specifically, the antiferromagnetic layer, which is required for the general spin valve type CPP-GMR element, becomes not required, and in addition, the ferromagnetic layer in the "synthetic pinned structure" also becomes not required.

In order to form the DFL element structure in the prior art, it becomes necessary for the two ferromagnetic layers 61 and 62 to be exchange-coupled so as to have their magnetizations 61a and 62a to be antiparallel with each other. Such structure is easily formable by inserting metal, such as Au, Ag, Cu, Ir, Rh, Ru or Cr, between the two ferromagnetic layers 61 and 62, and by generating the exchange coupling between the two ferromagnetic layers 61 and 62.

However, in the TMR element, an insulating film, such as an aluminum oxide (AlOx) film or a magnetic oxide (MgO)

film, has to be intervened between the two ferromagnetic layers in order to obtain a tunnel effect, and inconvenience where it becomes difficult to generate strong exchange coupling between the two ferromagnetic layers can occur. As a result, it becomes extremely difficult to bring the magnetizations of the two ferromagnetic layers into the antiparallel state.

Further, in the head structure using the DFL element structure in the prior art, in order to develop bias magnetic field intensity that is sufficient to form the initial state from the permanent magnet HM, such as CoPt, arranged at the depth position that is opposite from ABS, the thickness of the permanent magnet HM has to be thicker. If the thickness of the permanent magnet HM becomes thicker, an advantage where the DFL element structure is a structure that can narrow the read gap cannot be a sufficient benefit. If the thickness of the permanent magnet HM is attempted to be thickened and the read gap is attempted to be narrowed, the space between the permanent magnet HM and first and second shields layers 71 and 72 become smaller, the bias magnetic field to be generated from the permanent magnet HM pass through the first and second shield layers 71 and 72 and application of the bias magnetic field to the element becomes insufficient, and a problem where a resistive change of the element cannot be sufficiently detected can occur.

In addition, in the head structure using the DFL element structure in the prior art, the initial state in the two ferromagnetic layers 61 and 62 is attempted to be formed by arranging the permanent magnet HM at the depth position that is opposite from ABS, and by applying the bias magnetic field from the permanent magnet HM to the two ferromagnetic layers 61 and 62. However, the bias magnetic field from the permanent magnet HM may leak, and problems where a signal is written into the medium due to the leaked magnetic field by mistake, and the signal recorded in the medium may be demagnetized or degaussed also occur.

SUMMARY OF THE INVENTION

In order to meet the recent demand for high recording density, the present invention targets at providing an MR element that adopts a structure enabling to narrow the read gap (a space between the first and second shield layers) and to improve the line recording density, that can improve sensitivity (reader performance) to an external magnetic field to be detected, and suppress false writing of a signal into a medium, demagnetization or degaussing of the recoded signal in the medium; a thin film magnetic head including the MR element; and an HGA and a magnetic disk apparatus including the thin film magnetic head.

In order to achieve the above objects, the present invention provides a magnetoresistive effect element (MR element) with a current-perpendicular-to-plane (CPP) structure including a magnetoresistive effect part (MR part), and a first shield layer and a second shield layer that are formed by lamination so as to interpose the MR part, and in which a sense current is applied in the lamination direction. The MR part comprises a nonmagnetic intermediate layer, and a first ferromagnetic layer and a second ferromagnetic layer formed by lamination so as to interpose the nonmagnetic intermediate layer from upper and lower sides. The first shield layer and the second shield layer respectively have an inclining magnetization structure of which a magnetization is inclined with regard to a track width direction. The first ferromagnetic layer is directly or indirectly and magnetically coupled with the first shield layer, the second ferromagnetic layer is directly or indirectly and magnetically coupled with the second shield layer. A magnetization direction adjustment layer composed of a magnetic body for adjusting at least a magnetization direction of the first ferromagnetic layer is positioned at a rear end surface side of the first ferromagnetic layer, the rear end surface side is an opposite side of a front end surface receiving a magnetic field to be detected in the MR part.

As in the invention (Invention 1) above, in the MR element where the first ferromagnetic layer and the second ferromagnetic layer are directly or indirectly and magnetically coupled with the first shield layer and the second shield layer having an inclined magnetization structure, respectively, because magnetic coupling between the first shield layer and the first ferromagnetic layer, and, between the second shield layer and the second ferromagnetic layer is weak, the magnetization of the first ferromagnetic layer and the second ferromagnetic layer is likely to become closer to an antiparallel state with each other due to the static magnetic coupling and the effect of antimagnetic field of the first ferromagnetic layer and the second ferromagnetic layer. This causes a decrease in output or an increase in an asymmetry property of signal waveform, and sensitivity to the external magnetic field to be detected may be decreased.

However, according to the invention (Invention 1), since the magnetizations of the first ferromagnetic layer and the second ferromagnetic layer can be maintained to be substantially orthogonalized with each other by positioning a magnetization direction adjustment layer composed of a magnetic body for adjusting at least the magnetization direction of the first ferromagnetic layer at least at a rear end surface side of the first ferromagnetic layer, the rear end surface side being an opposite side of a front end surface receiving the magnetic field to be detected in the magnetoresistive effect part (MR part), the sensitivity to the external magnetic field to be detected can be improved.

Further, according to the invention (Invention 1), since any bias magnetic field application part (such as a hard magnetic body or magnet) for applying a bias magnetic field to the first ferromagnetic layer and the second ferromagnetic layer does not have to be arranged, but their magnetizations can be substantially orthogonalized with each other, false writing into a medium due to leakage of the bias magnetic field or demagnetization or degaussing of the recorded signal in the medium can also be suppressed.

In the above invention (Invention 1), the magnetization direction adjustment layer is preferably positioned at the rear end surface sides of the first ferromagnetic layer and the second ferromagnetic layer (Invention 2). In the above invention (Invention 2), the magnetization direction adjustment layer preferably has a first magnetization direction adjustment layer positioned at the rear end surface side of the first ferromagnetic layer and a second magnetization direction adjustment layer positioned at the rear end surface side of the second ferromagnetic layer, and an insulating layer is positioned between the first magnetization direction adjustment layer and the second magnetization direction adjustment layer (Invention 3).

In the above invention (Invention 1), the magnetization direction adjustment layer may be magnetically coupled with the first shield layer and/or the second shield layer (Invention 4). In the above invention (Invention 4), between the magnetization direction adjustment layer and the first shield layer and/or the second shield layer, a coupling layer that magnetically couples these layers is preferably positioned (Invention 5).

In the above invention (Invention 1), an insulating layer is preferably positioned between the magnetization direction adjustment layer and the rear end surface side of the MR part (Invention 6).

In the above invention (Invention 1), it is preferred that, between the first ferromagnetic layer and the first shield layer, a first exchange-coupling functional gap layer for indirectly and magnetically coupling these layers is positioned, and that, between the second ferromagnetic layer and the second shield layer, a second exchange-coupling functional gap layer for indirectly and magnetically coupling these layer is positioned.

In the above invention (Invention 7), it is practical that the first exchange-coupling functional gap layer includes an exchange-coupling transmitting layer, a gap adjustment layer and an exchange-coupling adjustment layer sequentially from the first shield layer side, and the second exchange-coupling functional gap layer includes an exchange-coupling transmitting layer, a gap adjustment layer and an exchange-coupling adjustment layer sequentially from the second shield layer side (Invention 8). Also, it is practical that the first exchange-coupling functional gap layer includes a first composite layer in which an exchange-coupling transmitting layer and a gap adjustment layer are alternately repeatedly laminated, and an exchange-coupling adjustment layer that is positioned at the first ferromagnetic layer side, and the second exchange-coupling functional gap layer includes a second composite layer in which an exchange-coupling transmitting layer and a gap adjustment layer are alternately repeatedly laminated, and an exchange-coupling adjustment layer that is positioned at the second ferromagnetic layer side (Invention 9).

In the above invention (Invention 1), it is preferred that a first antiferromagnetic layer adjacent to the first shield layer, and a second antiferromagnetic layer adjacent to the second shield layer, and that the first shield layer, the MR part and the second shield layer are interposed by the first antiferromagnetic layer and the second antiferromagnetic layer from upper and lower sides, a blocking temperature of an antiferromagnetic material composing the second antiferromagnetic layer is higher than that of an antiferromagnetic material composing the first antiferromagnetic layer.

In the above invention (Invention 1), it is preferred that the MR element does not have a hard magnetic body or a magnet for applying a bias magnetic field to the first ferromagnetic layer and the second ferromagnetic layer (Invention 11).

Further, the present invention provide a thin film magnetic head having an air bearing surface (ABS) opposing to a recording medium, and the MR element according to the above invention (Invention 1) arranged in the vicinity of the ABS for detecting a signal magnetic field from the recording medium (Invention 12).

Further this invention provides a head gimbal assembly (HGA) including a slider including the thin film magnetic head according to the above invention (invention 12), and arranged opposing to a recording medium, and a suspension that elastically supports the slider (Invention 13).

Furthermore, the present invention provides a magnetic disk apparatus having a slider including the thin film magnetic head according to the above invention (Invention 12), and arranged opposing to a recording medium, and a positioning device that supports and positions the slider with regard to the recording medium.

According to the present invention, the MR element that adopts the structure where the read gap (a space between the first and second shield layers) can be narrowed and can attempt to improve the line recording density, and, that can improve the sensitivity (reader performance) to the external magnetic field to be detected, and that can suppress the false writing of a signal into a medium and demagnetization or degaussing of the recorded signal in the medium; the thin film magnetic head including the MR element; and the HGA and the magnetic disk apparatus including the thin film magnetic head can be provided.

DESCRIPTION OF THE PREFERRED EMBODIMENTS

Before explaining embodiments of the present invention, terms used in the present specification are defined. In the present specification, a dimension in the X-axis direction, a dimension in the Y-axis direction and a dimension in the Z-axis direction in each diagram are indicated as "width", "length" and "thickness", respectively. Further, a side closer to an air bearing surface (a surface of the thin film magnetic head opposing to a recording medium) out of surfaces in the Y-axis direction is indicated as "forward" and its opposite side (depth side) is indicated as "rearward". In addition, in the lamination structure of an element or the element structure, a substrate direction is referred to as "downward" or "lower side", and its opposite direction is referred to as "upward" or "upper side" viewing from a layer or an element to be a reference.

[MR element]

The MR element relating to an embodiment of the present invention is explained with reference to drawings.

Figure 1:
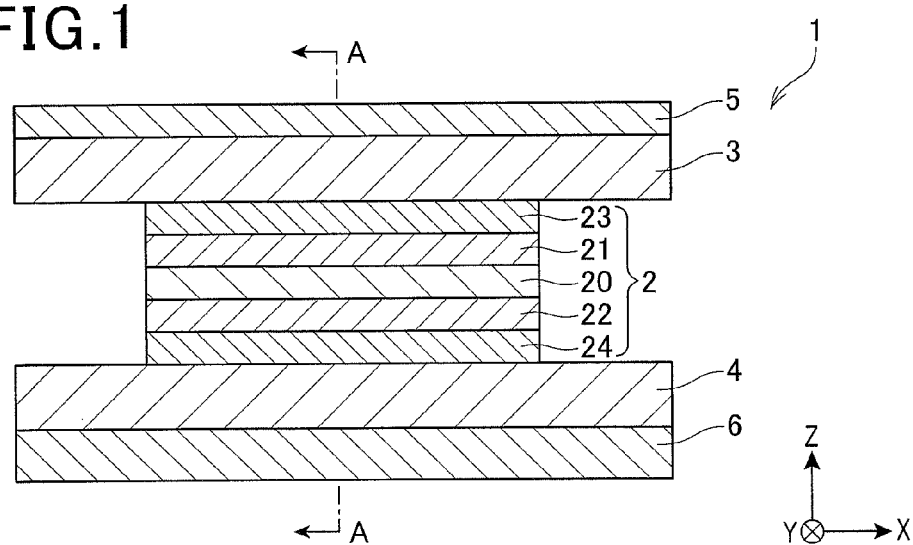
FIG. 1 is a plan view showing an MR element with a CPP structure (CPP-MR element) relating to one embodiment of the present invention in a pattern manner, viewing from the ABS side.
Figure 2:
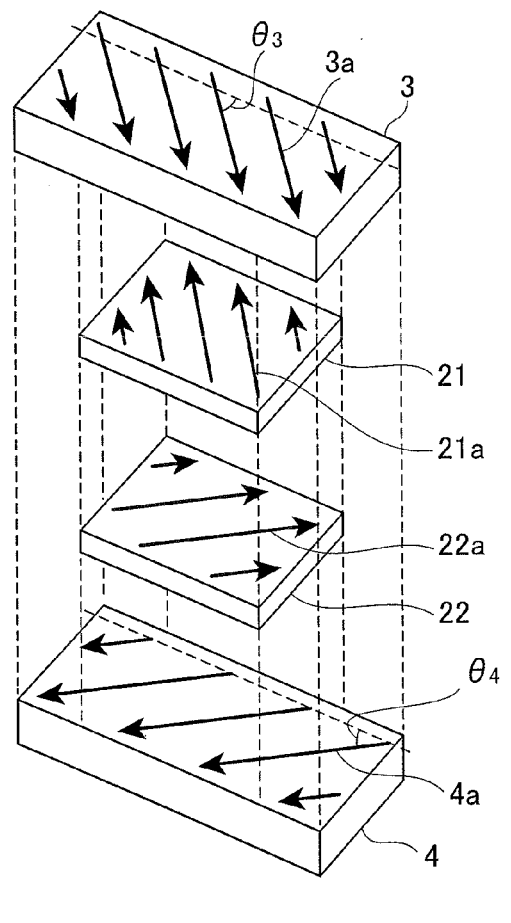
FIG. 2 is an exploded perspective view showing with the separation of each component part for explaining the structure of the MR element relating to one embodiment of the present invention.
Figure 3:
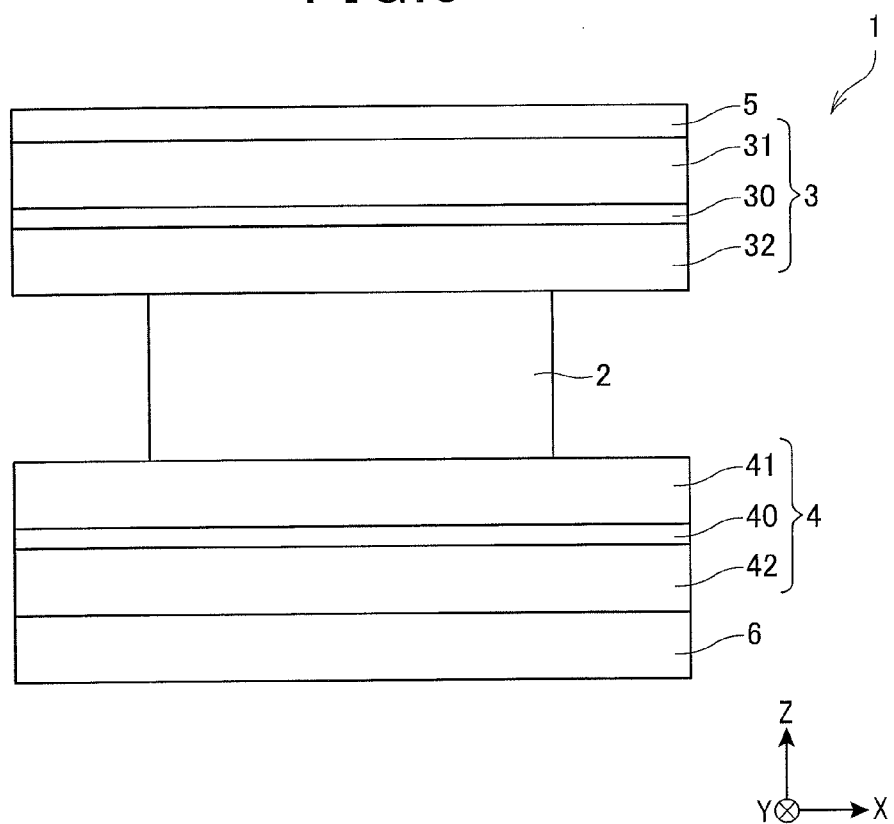
FIG. 3 is a plan view showing another configuration example of the MR element relating to one embodiment of the present invention in a pattern manner, viewing from the ABS side.

FIG. 1 is a plan view of the MR element with a CPP structure (CPP-MR element) out of the reproducing head in the present embodiment in a pattern manner, viewing from the ABS side; FIG. 2 is an exploded perspective view showing with separation of each component part for explaining the structure of the MR element relating to the present embodiment; FIG. 3 is a plan view showing another configuration example of the MR element relating to the present embodiment in a perspective manner viewing from the ABS side; FIG. 4 is an exploded perspective view showing magnetization states of the first shield layer and the second shield layer in the MR element shown in FIG. 3 in a pattern manner; and FIG. 5 is a cross-sectional view of the MR element shown in FIG. 1 along the A-A line.

As shown in FIG. 1, an MR element 1 has an MR part 2; a first shield layer 3 formed by lamination so as to interpose this MR part 2 from top and bottom; and a second shield layer 4, and has a current-perpendicular-to-plane (CPP) structure by applying a sense current in this lamination direction.

MR Part

The MR part 2 has a nonmagnetic intermediate layer 20, and, a first ferromagnetic layer 21 and a ferromagnetic layer 22 formed by lamination so as to interpose the nonmagnetic intermediate layer 20 between an upper side and a lower side. A multilayer body of these three layers (the first ferromagnetic layer 21, the nonmagnetic intermediate layer 20 and the second ferromagnetic layer 22) is a sensor region, and total thickness of this multilayer body is approximately 10 nm to 30 nm. In addition, the MR part 2 has a first exchange-coupling functional gap layer 23 and a second exchange-coupling functional gap layer 24 intervened between this sensor region and the first shield layer 3 and between this sensor region and the second shield layer 4, respectively. Furthermore, a non-magnetic layer (insulating layer) made of alumina ($Al_2O_3$) or a magnetic layer (not shown) for defining track width for reading is arranged at both side surfaces of the MR part 2 in the track width direction (X direction), respectively.

The first ferromagnetic layer 21 and the second ferromagnetic layer 22 have a function as a so-called free layer to be affected by an externally-applied magnetic field (external magnetic field) and to change the magnetization direction in response to the external magnetic field, respectively.

As a material to compose the first ferromagnetic layer 21 and the second ferromagnetic layer 22, NiFe, CoFe, CoFeB, CoFeNi, $Co_2MnSi$, $Co_2MnGe$ and $FeO_x$ (ferric oxide) can be exemplified). Thickness of the first ferromagnetic layer 21 and the second ferromagnetic layer 22 can be approximately 0.5 nm to 8 nm, respectively.

The nonmagnetic intermediate layer 20 is an essential film for expressing an MR effect in the MR element 1 relating to the present embodiment. As a material to compose the nonmagnetic intermediate layer 20, Cu, Au, Ag, Zn, Ga, $TiO_x$, ZnO, InO, SnO, GaN, ITO (indium tin oxide), $Al_2O_3$ and MgO can be exemplified. Preferably, the nonmagnetic intermediate layer 20 is composed of two or more layers of laminated film. For example, the nonmagnetic intermediate layer 20 is preferably composed of a three-layer laminated film with Cu/ZnO/Cu. Further, it is preferable to compose the nonmagnetic intermediate layer 20 with a three-layer lamination film with Cu/ZnO/Zn where one Cu is substituted by Zn since the output can be improved. Furthermore, the thickness of the nonmagnetic intermediate layer 20 can be approximately 0.5 nm to 5 nm.

As described later, in the present embodiment, magnetizations 21a and 22a of the first ferromagnetic layer 21 and the second ferromagnetic layer 22 are substantially orthogonalized (an angle intersecting with the magnetizations 21a and 22a is approximately 90°±15°) with each other by inclining magnetizations 3a and 4a of the first shield layer 3 and the second shield layer 4 at predetermined angles $\theta_3$ and $\theta_4$, respectively; by indirectly and magnetically coupling the first shield layer 3 and the second shield layer 4 with the first ferromagnetic layer 21 and the second ferromagnetic layer 22 functioning as a so-called free layer, respectively, by intervening the first exchange-coupling functional gap layer 23 and the second exchange-coupling functional gap layer 24; and, by positioning a magnetization direction adjustment layer 8 rearward (at the depth side of) the MR part 2 (see FIG. 2). Consequently, in the present embodiment, it is unnecessary to exchange-couple the first ferromagnetic layer 21 and the second ferromagnetic layer 22. Therefore, as the nonmagnetic intermediate layer 20 intervening in between these, for example, a nonmagnetic layer made of an oxide semiconductor, such as ZnO, is applicable. As a result, an effect of spin torque due to an electric current flowing in the lamination direction of the element can be suppressed, and a magnetoresistive ratio (MR ratio) can be improved. Further, since it is unnecessary to exchange-couple the first ferromagnetic layer 21 and the second ferromagnetic layer 22, the range of choices for a constituent material of the nonmagnetic intermediate layer 20 is expanded and a degree of design freedom becomes greater.

First Shield Layer and Second Shield Layer

The first shield layer 3 and the second shield layer 4 have a magnetic shield function from an external magnetic field and a function as an electrode on the occasion of applying a sense current. Furthermore, in the present embodiment, the first shield layer 3 and the second shield layer 4 do not have to have the function as an electrode, and separately from the first shield layer 3 and the second shield layer 4, a new electrode layer can be additionally laminated.

As a material to compose the first shield layer 3 and the second shield layer 4, NiFe (permalloy), CoZrTa, sendust, NiFeCo, CoZrNb and CoFe can be exemplified. Further, the thickness (Z direction) of the first shield layer 3 and the second shield layer 4 can be 10 nm to 3 μm.

As shown in FIG. 2, the first shield layer 3 and the second shield layer 4 have an inclining magnetization structure where their magnetizations 3a and 4a are inclined at predetermined angles $\theta_3$ and $\theta_4$ (for example, approximately 45°) with regard to the track width direction (X direction). Then, in so far as the magnetizations 21a and 22a of the first ferromagnetic layer 21 and the second ferromagnetic layer 22 are substantially orthogonalized with each other, the magnetizations 3a and 4a of the first shield layer 3 and the second shield layer 4 may be substantially orthogonalized with each other, and does not have to be substantially orthogonalized with each other. Furthermore, when the magnetizations 3a and 4a of the first shield layer 3 and the second shield layer 4 are substantially orthogonalized with each other, an angle where these magnetizations 3a and 4a are intersected can be at approximately 90°±15°.

A first antiferromagnetic layer 5 is adjacently formed on the first shield layer 3, and a second antiferromagnetic layer 6 is adjacently formed under the second shield layer 4. With these layers, the magnetization 3a of the first shield layer 3 is secured in an inclined state at a predetermined angle $\theta_3$ (for example, approximately 45°) with regard to the track width direction (X direction) due to the exchange coupling between the first shield layer 3 and the first antiferromagnetic layer 5. Further, the magnetization 4a of the second shield layer 4 is secured in an inclined state at a predetermined angle $\theta_4$ (for example, approximately 45°) with regard to the track width direction (X direction) due to the exchange coupling between the second shield layer 4 and the second antiferromagnetic layer 6.

As described above, the first exchange-coupling functional gap layer 23 intervenes between the first shield layer 3 and the first ferromagnetic layer 21, and the second exchange-coupling functional gap layer 24 intervenes between the second shield layer 4 and the second ferromagnetic layer 22. With these layers, the first ferromagnetic layer 21 is indirectly and magnetically coupled with the first shield layer 3 where the direction of the magnetization 3a is inclined at the predetermined angle $\theta_3$ with regard to the track width direction (X direction), via the first exchange-coupling functional gap layer 23. Further, the second ferromagnetic layer 22 is indirectly and magnetically coupled with the second shield layer 4 where the direction of the magnetization 4a is inclined at the predetermined angle $\theta_4$ with regard to the track width direction (X direction), via the second exchange-coupling functional gap layer 24.

Consequently, in the MR element 1 relating to the present embodiment, because the first shield layer 3 and the second shield layer 4 have an inclining magnetization structure where the magnetizations 3a and 4a of the first shield layer 3 and the second shield layer 4 are inclined at the predetermined angles $\theta_3$ and $\theta_4$ with regard to the track width direction (X direction), respectively, and, the magnetization direction adjustment layer 8 to be described later is positioned rearward (at the depth side of) the MR part 2, the magnetizations 21a and 22a of the first ferromagnetic layer 21 and the second ferromagnetic layer 22 that are indirectly and magnetically coupled with the first shield layer 3 and the second shield layer 4 shall be substantially orthogonalized with each other, respectively (see FIG. 12A).

Therefore, according to the MR element 1 relating to the present embodiment, in order to substantially orthogonalize the magnetizations 21a and 22a of the first ferromagnetic layer 21 and the second ferromagnetic layer 22 with each other, it is unnecessary to arrange a bias magnetic field application part made of, for example, a hard magnetic body or magnet, rearward (at the depth side of) those (first ferromagnetic layer 21 and the second ferromagnetic layer 22). As a result, a so-called "read gap" can be narrowed.

Further, in order to substantially orthogonalize the magnetizations 21a and 22a of the first ferromagnetic layer 21 and the second ferromagnetic layer 22 with each other, even if a hard magnetic body or magnet is arranged rearward (at the depth side of) those (the first ferromagnetic layer 21 and the second ferromagnetic layer 22), a magnetization direction of the magnet may fluctuate due to the effect of a peripheral magnetic field. If the magnetization direction of the magnet fluctuates, the directions of the magnetizations 21a and 22a of the first ferromagnetic layer 21 and the second ferromagnetic layer 22 also fluctuate, and sensitivity (reader performance) to the external magnetic field to be detected is like to be decreased. However, in the present embodiment, because a hard magnetic body or magnet is not arranged rearward (at the depth side of) the first ferromagnetic layer 21 and the second ferromagnetic layer 22, the directions of the magnetizations 21a and 22a of the first ferromagnetic layer 21 and the second ferromagnetic layer 22 can be stabilized, and the sensitivity (reader performance) to the external magnetic field to be detected can be improved. Furthermore, the substantial orthogonalization between the magnetization 21a of the first ferromagnetic layer 21 and the magnetization 22a of the second ferromagnetic layer 22 can be at approximately 90°±15°.

As shown in FIG. 3, the first shield layer 3 may include an upper nonmagnetic layer 30 and two first shield layers 31 and 32 formed by lamination so as to interpose the upper nonmagnetic layer 30 from upper and lower sides.

Figure 4A:
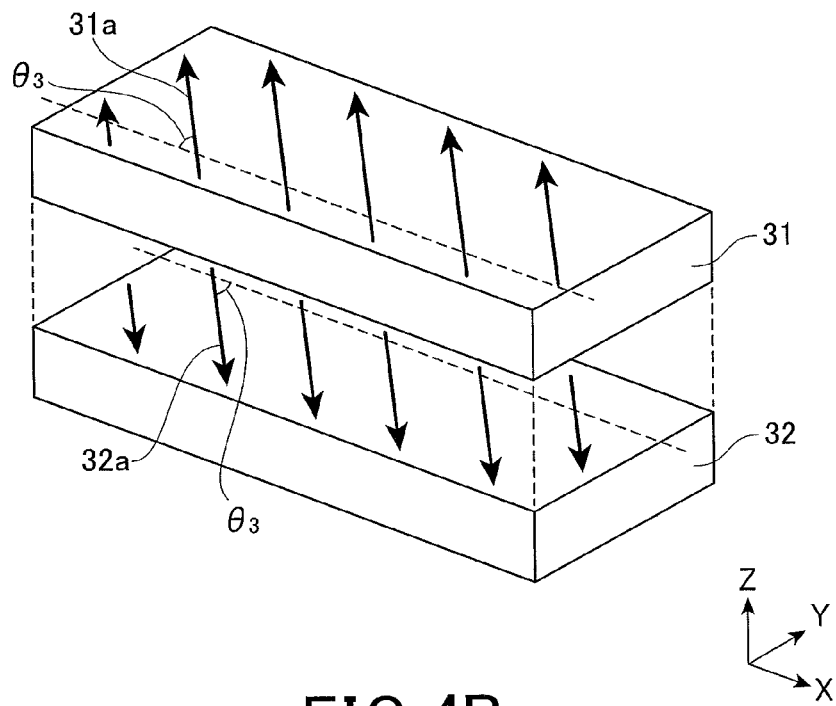
FIG. 4A is an exploded perspective view showing a magnetization state of the first shield layer in the MR element shown in FIG. 3 in a pattern manner.
Figure 5:
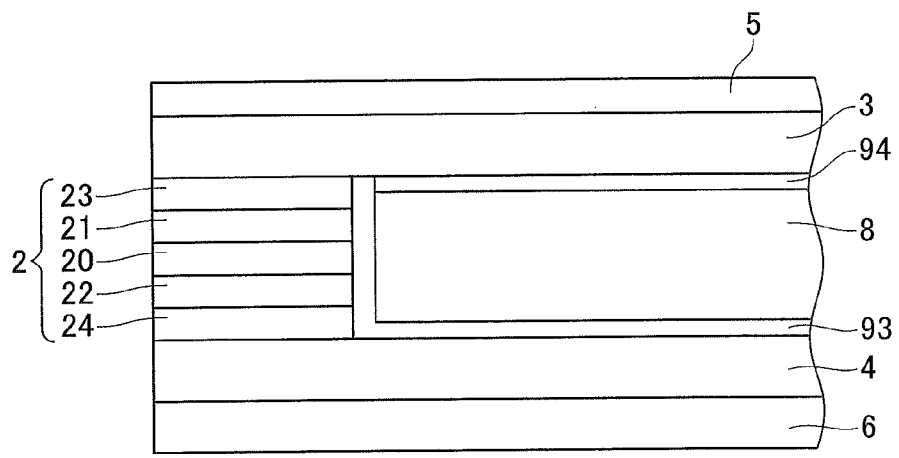
FIG. 5 is a cross-section view along an A-A line in the MR element shown in FIG. 1, showing the configuration of the magnetization direction adjustment layer in one embodiment of the present invention in a pattern manner.
Figure 5:
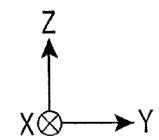

In this case, the first shield layers 31 and 32 have an inclining magnetization structure where their magnetizations 31a and 32a are inclined at the predetermined angle $\theta_3$ with regard to the track width direction (X direction), and exchange-coupled via the upper nonmagnetic layer 30 so as to have the magnetizations 31a and 32a to be in an antiparallel state with each other (see FIG. 4A).

Further, as shown in FIG. 3, the second shield layer 4 may similarly include a lower side nonmagnetic layer 40 and two second shield layers 41 and 42 formed by lamination so as to interpose the lower nonmagnetic layer 40 from upper and lower sides.

Figure 4B:
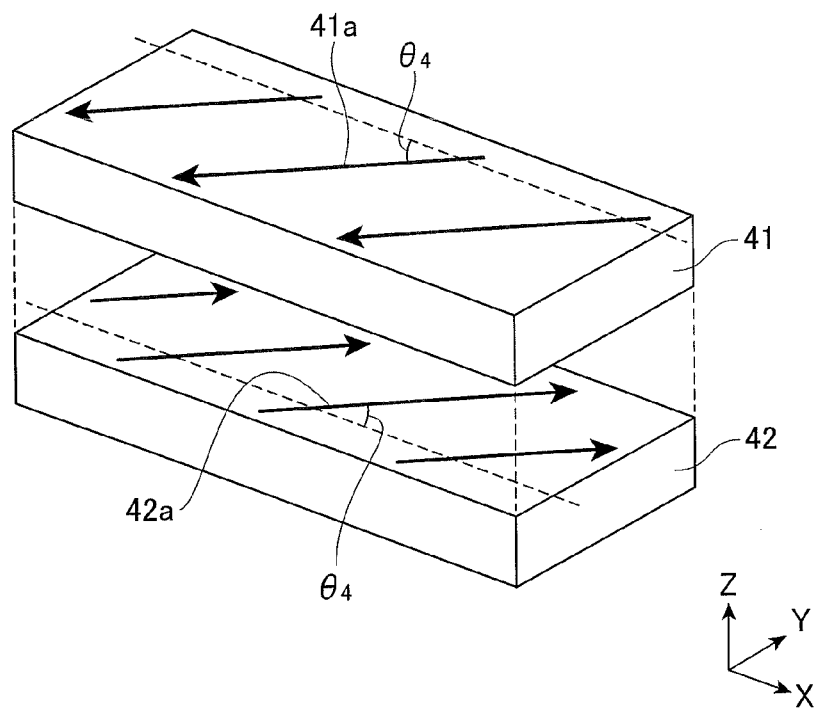
FIG. 4B is an exploded perspective view showing a magnetization state of the second shield layer in the MR element shown in FIG. 3 in a pattern manner.

In this case, the second shield layers 41 and 42 have an inclining magnetization structure where their magnetizations 41a and 42a are inclined at the predetermined angle $\theta_4$ with regard to the track width direction (X direction), and exchange-coupled via the lower nonmagnetic layer 40 so as to have the magnetizations 41a and 42a to be in an antiparallel state with each other (see FIG. 4B).

Because of having such configuration, since the magnetization 31a of the first shield layer 31 and the magnetization 32a of the first shield layer 32 are in the antiparallel state with each other, and the magnetization 41a of the second shield layer 41 and the magnetization 42a of the second shield layer 42 are in the antiparallel state with each other, any leakage of the magnetic field from the first shield layer 3 or the second shield layer 4 can be further suppressed. As a result, false writing into a medium or demagnetization or degaussing due to the leaked magnetic field from the first shield layer 3 and second shield layer 4 can be further effectively prevented.

Magnetization Direction Adjustment Layer

As shown in FIG. 5, the magnetization direction adjustment layer 8 is positioned at the rear end surface side (rearward (at depth side of) the MR part 2), which is at the opposite side of the front end surface (end surface at the ABS side) receiving a magnetic field to be detected in the MR part 2 by intervening an insulating layer 93, such as $Al_2O_3$. The magnetization direction adjustment layer 8 is made of, for example, NiFe, CoFe, CoFeB, CoFeNi, $Co_2MnSi$, $Co_2MnGe$ or $FeO_x$ (ferric oxide).

The insulating layer 93, such as $Al_2O_3$, intervenes between the magnetization direction adjustment layer 8 and the second shield layer 4, and a nonmagnetic layer 94, such as $Al_2O_3$, $SiO_2$ or $TiO_2$, intervenes between the magnetization direction adjustment layer 8 and the first shield layer 3.

As described above, the magnetizations 21a and 22a of the first ferromagnetic layer 21 and the second ferromagnetic layer 22 are indirectly and magnetically coupled with the first shield layer 3 and the second shield layer 4 having an inclining magnetization structure, by having the first exchange-coupling functional gap layer 23 and the second exchange-coupling functional gap layer 24 intervened, respectively.

However, since the magnetic coupling between the first shield layer 3 and the first ferromagnetic layer 21, and, between the second shield layer 4 and the second ferromagnetic layer 22 is weak, respectively, the magnetizations 3a and 4a of the first shield layer 3 and the second shield layer 4 may fluctuate so as to be closer to the antiparallel state with each other due to the static magnetic coupling between the first ferromagnetic layer 21 and the second ferromagnetic layer 22 and an effect of an antimagnetic field. Then, the magnetizations 21a and 22a of the first ferromagnetic layer 21 and the second ferromagnetic layer 22 may also fluctuate so as to be closer to the antiparallel state with each other. In particular, in a portion closer to the front end surface (end surface at the ABS side) receiving a magnetic field to be detected in the MR part 2, the magnetizations 21a and 22a may fluctuate so as to be closer to the antiparallel state with each other. In addition, the magnetizations 21a and 22a may fluctuate so as to be closer to the antiparallel state with each other due to an effect of the antiferromagnetic coupling magnetic field acting on between the first ferromagnetic layer 21 and the second ferromagnetic layer 22. If the magnetizations 21a and 22a of the first ferromagnetic layer 21 and the second ferromagnetic layer 22 become closer to the antiparallel state with each other, the decrease in the reproducing output and the increase in asymmetry of the signal waveform occur, and the sensitivity (reader performance) to the external magnetic field to be detected is like to be decreased. In particular, in the first ferromagnetic layer 21, because of the manufacturing steps to be described later, the magnetic coupling with the first shield layer 3 is weak and the direction of the magnetization 21a easily fluctuates. Consequently, it is difficult to substantially orthogonalize the magnetizations 21a and 22a of the first ferromagnetic layer 21 and the second ferromagnetic layer 22 with each other only by the magnetic coupling between the first shield layer 3 and the first ferromagnetic layer 21 and the magnetic coupling between the second shield layer 4 and the second ferromagnetic layer 22.

From this point of view, in the MR element 1 relating to the present embodiment, as in a mode shown in FIG. 5, since the antiferromagnetic coupling magnetic field acting on between the first ferromagnetic layer 21 and the second ferromagnetic layer 22 is absorbed by the magnetization direction adjustment layer 8 because the magnetization direction adjustment layer 8 is positioned rearward (at the depth side of) the MR part 2, the magnetizations 21a and 22a of the first ferromagnetic layer 21 and the second ferromagnetic layer 22 can be maintained in the substantially-orthogonalize state with each other.

In addition, in the MR element 1 relating to the present embodiment, because the nonmagnetic layer 94 intervenes between the first shield layer 3 and the magnetization direction adjustment layer 8, the magnetization direction adjustment layer 8 and the first shield layer 3 will never be magnetically coupled. If the magnetization direction adjustment layer 8 and the first shield layer 3 are magnetically coupled, a bias magnetic field in the same direction shall act on the first ferromagnetic layer 21 and the second ferromagnetic layer 22. With this action, either one of magnetization of the first ferromagnetic layer 21 or the second ferromagnetic layer 22 (for example, the magnetization 21a of the first ferromagnetic layer 21) is reverted and becomes closer to the parallel direction with the track width direction (X direction), and the other magnetization (for example, the magnetization 22a of the second ferromagnetic layer 22) is emphasized and easily becomes closer to the direction that is orthogonal to the track width direction (X direction). Consequently, it is likely to become difficult to substantially orthogonalize the magnetizations 21a and 22a of the first ferromagnetic layer 21 and the second ferromagnetic layer 22 with each other, and, the directions of the magnetizations 21a and 22a of the first ferromagnetic layer 21 and the second ferromagnetic layer 22 become left-right asymmetrical upon viewing from the ABS side, and the sensitivity (reader performance) to the external magnetic field to be detected is like to be decreased.

Figure 6:
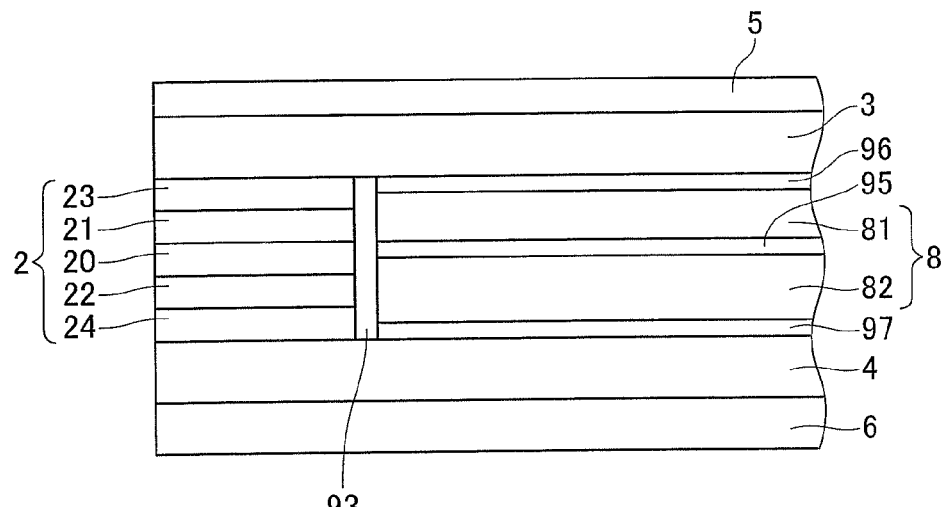
FIG. 6 is a cross-section view along the A-A line in the MR element shown in FIG. 1, showing another configuration example (No. 1) of the magnetization direction adjustment layer in one embodiment of the present invention in a pattern manner.
Figure 6:
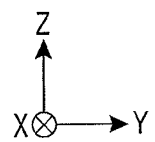

Further, the magnetization direction adjustment layer 8, for example, as shown in FIG. 6, may have a structure where a first magnetization direction adjustment layer 81 positioned at the first shield layer 3 side and a second magnetization direction adjustment layer 82 positioned at the second shield layer 4 side are laminated via the insulating layer 95 in between them.

In this case, the first magnetization direction adjustment layer 81 and the first shield layer 3 are magnetically coupled, and the second magnetization direction adjustment layer 82 and the second shield layer 4 are magnetically coupled. As described above, it is difficult to orthogonalize the magnetizations 21a and 22a of the first ferromagnetic layer 21 and the second ferromagnetic layer 22 only by the magnetic coupling between the first shield layer 3 and the first ferromagnetic layer 21 and the magnetic coupling between the second shield layer 4 and the second ferromagnetic layer 22 with each other. However, because the magnetization direction adjustment layer 8 (the first magnetization direction adjustment layer 81 and the second ferromagnetic adjustment layer 82) is positioned rearward (at the depth side of) the MR part 2 (the first magnetic layer 21 and the second ferromagnetic layer 22), and, the first magnetization direction adjustment layer 81 and the first shield layer 3 are magnetically coupled and the second magnetization direction adjustment layer 82 and the second shield layer 4 are magnetically coupled, an assist magnetic field for suitably maintaining the directions of their magnetizations 21a and 22a can be applied to the first ferromagnetic layer 21 and the second ferromagnetic layer 22 from the magnetization direction adjustment layer 8 (the first magnetization direction adjustment layer 81 and the second magnetization direction adjustment layer 82). Therefore, the output can be improved, and the asymmetry of the signal waveform can be reduced.

The magnetic coupling between the first magnetization direction adjustment layer 81 and the first shield layer 3, and, between the second magnetization direction adjustment layer 82 and the second shield layer 4 may be direct coupling, and as shown in FIG. 6, those (the first magnetization direction adjustment layer 81 and the first shield layer 3, and, the second magnetization direction adjustment layer 82 and the second shield layer 4) can be ferromagnetically exchange-coupled by having exchange-coupled layers 96 and 97, such as Ru, intervened.

Figure 7:
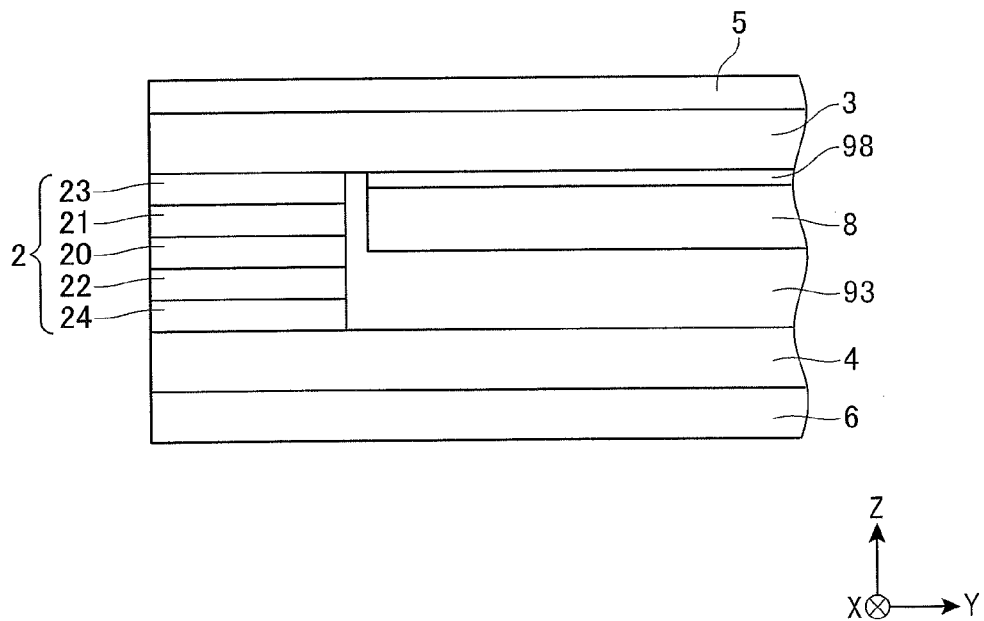
FIG. 7 is a cross-section view along the A-A line in the MR element shown in FIG. 1, showing another configuration example (No. 2) of the magnetization direction adjustment layer in one embodiment of the present invention in a pattern manner.

In addition, as shown in FIG. 7, the magnetization direction adjustment layer 8 may be positioned only at the depth in the Y direction of the first ferromagnetic layer 21, and the insulating layer 93, such as $Al_2O_3$, may be positioned at the depth in the Y direction of the second ferromagnetic layer 22.

In this case, the magnetization direction adjustment layer 8 and the first shield layer 3 are magnetically coupled. Since the coupling intensity between the first shield layer 3 and the first ferromagnetic layer 21 is anticipated to be weaker than that between the second shield layer 4 and the second ferromagnetic layer 22 due to the manufacturing steps to be described later, it is believed that the direction of the magnetization 21a can easily fluctuate by an effect of the antiferromagnetic field in the first ferromagnetic layer 21 compared to the second ferromagnetic layer 22. Consequently, even in the mode shown in FIG. 7, an assist magnetic field in order to suitably maintain the direction of the magnetization 21a of the first ferromagnetic layer 21 can be applied to the first ferromagnetic layer 21 where its magnetization direction is easily changed. In the meantime, since volume of the magnetization direction adjustment layer 8 can be reduced compared to modes shown in FIGS. 5 and 6, leakage of the assist magnetic field from the magnetization direction adjustment layer 8 can be effectively suppressed. As a result, the magnetizations 21a and 22a of the first ferromagnetic layer 21 and the second magnetic layer 22 can be maintained in the substantially-orthogonalized state with each other; the output can be improved and asymmetry of the signal waveform can be reduced; and the sensitivity (reader performance) to the external magnetic field to be detected can be improved. At the same time, false writing into a medium and/or degaussing or demagnetization that can occur because of the leakage of the assist magnetic field from the magnetization direction adjustment layer 8 can be suppressed.

Furthermore, the magnetic coupling between the magnetization direction adjustment layer 8 and the first shield layer 3 may be direct coupling, and as shown in FIG. 7, the magnetization direction adjustment layer 8 and the first shield layer 3 can be ferromagnetically exchange-coupled by having an exchange-coupling layer 98, such as Ru, intervened.

First and Second Exchange-Coupling Functional Gap Layers

Figure 8:
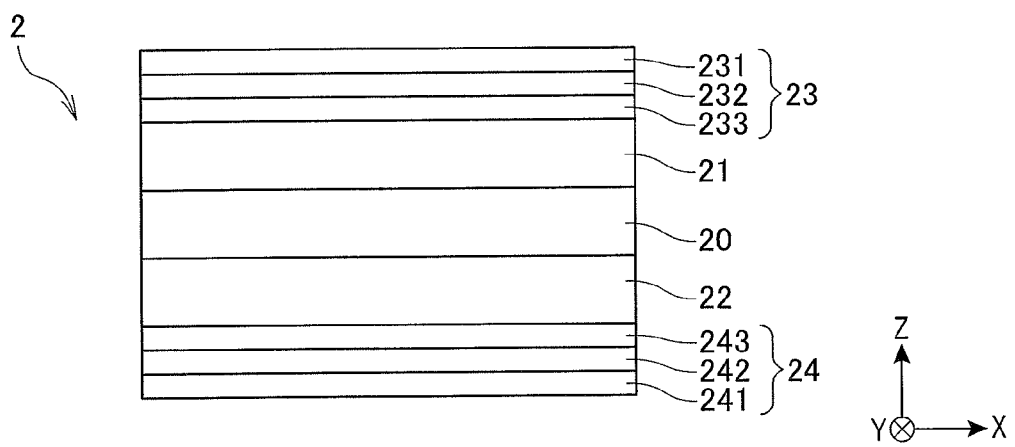
FIG. 8 is a plan view showing the magnetoresistive effect part (MR part) in one embodiment of the present invention in a pattern manner viewing from the ABS side.

As shown in FIG. 8, the first exchange-coupling functional gap layer 23 includes an exchange-coupling transmitting layer 231, a gap adjustment layer 232 and an exchange-coupling adjustment layer 233, viewing from the first shield layer 3 downward. The gap adjustment layer 232 is a so-called ferromagnetic layer composed of a ferromagnetic body.

The exchange-coupling transmitting layer 231 is made of at least one material selected from a group constituting Ru, Rh, Ir, Cr, Cu, Ag, Au, Pt and Pd. The intensity of the magnetic coupling between the first shield layer 3 and the gap adjustment layer 232 can be adjusted by setting the material to compose exchange-coupling transmitting layer 231 and its thickness. Further, the magnetization directionality of gap adjustment layer 232 that is magnetically coupled with the first shield layer 3 can be adjusted by setting the material composing the exchange-coupling transmitting layer 231 and its thickness. In other words, whether the coupling becomes antiferromagnetic coupling where the magnetizations are orientated toward the opposite directions (antiparallel) from each other and magnetically coupled, or the coupling becomes ferromagnetic coupling where the magnetizations are orientated toward the same direction (parallel) with each other and magnetically coupled can be adjusted according to the selections of a material and thickness of the exchange-coupling transmitting layer 231.

The exchange-coupling adjustment layer 233 is made of at least one material selected from a group constituting Ru, Rh, Ir, Cr, Cu, Ag, Au, Pt and Pd. The intensity of the magnetic coupling between the gap adjustment layer 232 and the first ferromagnetic layer 21 can be adjusted by setting the material and thickness of the exchange-coupling adjustment layer 233, respectively. Further, the directionality of the magnetization 21a of the first ferromagnetic layer 21 that is magnetically coupled with the gap adjustment layer 232 can be adjusted by setting the material composing the exchange-coupling adjustment layer 233 and its thickness, respectively. In other words, whether the coupling is antiferromagnetic coupling where the magnetizations are orientated toward the opposite directions (antiparallel) from each other and magnetically coupled, or the coupling is ferromagnetic coupling where the magnetizations are orientated toward the same direction (parallel) with each other and magnetically coupled that can be adjusted according to the selections of a material and thickness of the exchange-coupling transmitting layer 233.

In the present embodiment, it is necessary that the first ferromagnetic layer 21 functions as a so-called free layer that responds to an external magnetic field with high sensitivity. Consequently, the material and the thickness of the exchange-coupling transmitting layer 231 and the exchange-coupling adjustment layer 233 can be appropriately set in order for the intensity of the magnetic coupling between the first shield layer 3 and the gap adjustment layer 232 and that between the gap adjustment layer 232 and the first ferromagnetic layer 21 to be intensity that can sufficiently operate the first ferromagnetic layer 21 as a so-called free layer.

Furthermore, the thickness of the first exchange-coupling functional gap layer 23 can be set at approximately 1.5 nm to 6.0 nm.

The second exchange-coupling functional gap layer 24 includes the exchange-coupling transmitting layer 241, the gap adjustment layer 242 and the exchange-coupling adjustment layer 243, viewing from the second shield layer 4 side upward. The gap adjustment layer 242 is a so-called ferromagnetic layer composed of a ferromagnetic body.

The exchange-coupling transmitting layer 241 is made of at least one material selected from a group constituting Ru, Rh, Ir, Cr, Cu, Ag, Au, Pt and Pd. The intensity of the magnetic coupling between the second shield layer 4 and the gap adjustment layer 242 can be adjusted by setting the material composing the exchange-coupling transmitting layer 241 and its thickness. Further, the directionality of the magnetization of the gap adjustment layer 242 that is magnetically coupled with the second shield layer 4 can be adjusted by setting the material composing the exchange-coupling transmitting layer 241 and its thickness. In other words, whether the coupling is antiferromagnetic coupling where the magnetizations are orientated toward the opposite directions (antiparallel) from each other and magnetically coupled or the coupling is ferromagnetic coupling where the magnetizations are orientated toward the same direction (parallel) with each other and magnetically coupled can be adjusted according to the selections of a material and thickness of the exchange-coupling transmitting layer 241.

The exchange-coupling adjustment layer 243 is made of at least one material selected from a group constituting Ru, Rh, Ir, Cr, Cu, Ag, Au, Pt and Pd. The intensity of the magnetic coupling between the gap adjustment layer 242 and the second ferromagnetic layer 22 can be adjusted by setting the material composing the exchange-coupling adjustment layer 243 and its thickness. Further, the directionality of the magnetization 22a of the second ferromagnetic layer 22 that is magnetically coupled with the gap adjustment layer 242 can be adjusted by setting the material composing the exchange-coupling adjustment layer 243 and its thickness. In other words, whether the coupling is antiferromagnetic coupling where the magnetizations are orientated toward the opposite directions (antiparallel) from each other and magnetically coupled or the coupling is ferromagnetic coupling where the magnetizations are orientated toward the same direction (parallel) with each other and magnetically coupled can be adjusted by the selections for a material and thickness of the exchange-coupling adjustment layer 243.

In the present embodiment, it is necessary for the second ferromagnetic layer 222 to function as a so-called free layer that responds to the external magnetic field with high sensitivity as similar to the first ferromagnetic layer 21. Consequently, the material and thickness of the exchange-coupling transmitting layer 241 and the exchange-coupling adjustment layer 243 can be appropriately set in order for the intensity of the magnetic coupling between the second shield layer 4 and the gap adjustment layer 242 and that between the gap adjustment layer 242 and the second ferromagnetic layer 22 to be intensity that can operate the second ferromagnetic layer 22 as a so-called free layer.

The thickness of the second exchange-coupling functional gap layer 24 can be set at approximately 1.5 nm to 6.0 nm.

In the first and second exchange-coupling functional gap layers 23 and 24, the magnetic coupling between the first shield layer 3 and the gap adjustment layer 232, between the gap adjustment layer 232 and the first ferromagnetic layer 21, between the second shield layer 4 and the gap adjustment 242, and between the gap adjustment layer 242 and the second ferromagnetic layer 22 can be the antiferromagnetic coupling or can be ferromagnetic coupling. Even with either type of magnetic coupling, the magnetizations 21a and 22a of the first ferromagnetic layer 21 and the second ferromagnetic layer 22 should be substantially orthogonalized with each other. In particular, in the mode shown in FIG. 6, the magnetization directions of the first ferromagnetic layer 21 and the first magnetization direction adjustment layer 81, and, the magnetization directions of the second ferromagnetic layer 22 and the second magnetization direction adjustment layer 82 should be substantially matched, respectively. Further, in the mode shown in FIG. 7, the magnetization directions of the first ferromagnetic layer 21 and the magnetization direction adjustment layer 8 should be substantially matched. Furthermore, in either ones of the first ferromagnetic layer 21 and the first magnetization direction adjustment layer 81, and, the second ferromagnetic layer 22 and the second magnetization direction adjustment layer 82 in the mode shown in FIG. 6, and, the first ferromagnetic layer 21 and the magnetization direction adjustment layer 8 in the mode shown in FIG. 7, substantial matching of the magnetization directions shall mean that an angle formed by both magnetizations is 30 degrees or less or preferably 20 degrees or less.

Furthermore, in the first exchange-coupling functional gap layer 23 and the second exchange-coupling functional gap layer 24, as a constituent material of the exchange-coupling adjustment layers 233 and 243, a magnetic material, such as NiFe or CoFe, is usable.

Further, a predetermined space (gap) according to the recording density becomes required between a sensor region (the first ferromagnetic layer 21, the nonmagnetic intermediate layer 20 and the second ferromagnetic layer 22) and the first shield layer 3 or the second shield layer 4, respectively. This is because of certainly taking in an external magnetic field as a signal to the sensor region. If the space (gap) is likely to be taken in excessively more than necessary, other adjacent signal magnetic field in addition to the signal magnetic field to be taken in is also like to be taken in to the sensor region. Further, if the space (gap) does not reach a necessary distance but becomes too small, the signal magnetic field to be taken in to the sensor region shall be absorbed by the first shield layer 3 and the second shield layer 4 surrounding the sensor region, such signal magnetic field is not likely to be taken in to the sensor region.

In the MR element 1 relating to the present embodiment, the predetermined space (gap) can be secured by having the first exchange-coupling functional gap layer 23 and the second exchange-coupling functional gap layer 24.

Figure 9:
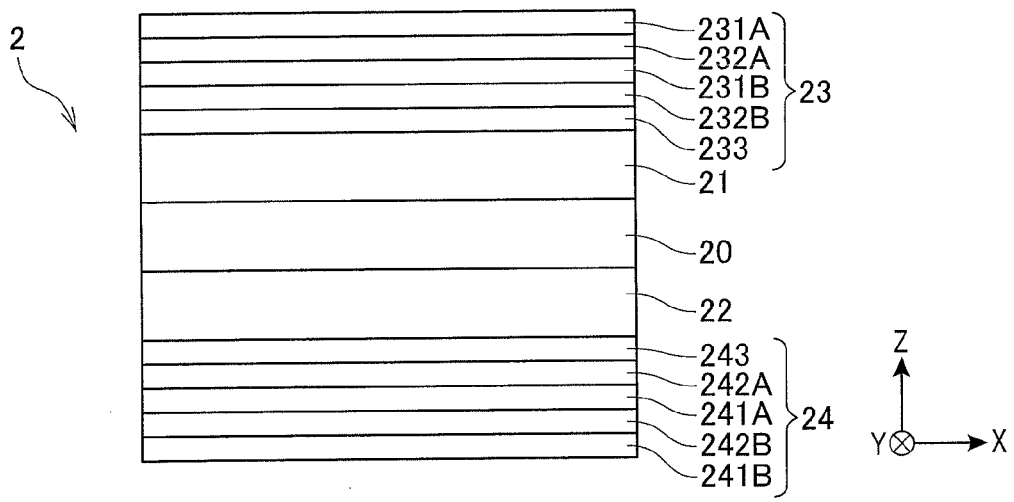
FIG. 9 is a plan view showing another configuration example of the MR part in one embodiment of the present invention in a pattern manner viewing from the ABS side.

In the MR part 2 relating of the present embodiment, the first exchange-coupling functional gap layer 23 and the second exchange-coupling functional gap layer 24 can be configured as shown in FIG. 9.

As shown in FIG. 9, the first exchange-coupling functional gap layer 23 can be configured sequentially including a first exchange-coupling transmitting layer 231A, a first gap adjustment layer 232A, a second exchange-coupling transmitting layer 231B, a second gap adjustment layer 232B and an exchange-coupling adjustment layer 233, viewing from the first shield layer 3 side downward. Further, the second exchange-coupling functional gap layer 24 can be configured sequentially including a second exchange-coupling transmitting layer 241B, a second gap adjustment layer 242B, a first exchange-coupling transmitting layer 241A, a first gap adjustment layer 242A and an exchange-coupling adjustment layer 243, viewing from the first shield layer 4 side downward. The first and second exchange-coupling transmitting layers 231A, 231B, 241A and 241B, the first and second gap adjustment layers 232A, 232B, 242A and 242B and the exchange-coupling layers 233 and 243 have the similar configuration to the exchange-coupling transmitting layers 231 and 241, the gap adjustment layers 232 and 242, and the exchange-coupling adjustment layers 233 and 243 shown in FIG. 5, respectively.

In the first exchange-coupling functional gap layer 23 and the second exchange-coupling functional gap layer 24 of the MR part 2 shown in FIG. 9, it becomes possible to reduce a response to the external magnetic field by matching magnetization volume of the two ferromagnetic layers with the first gap adjustment layers 232A and 242A and the second gap adjustment layers 232B and 242B, and by antiferromagnetically coupling with each other. Consequently, particularly preferable MR part 2 can be obtained by having the first exchange-coupling functional gap layer 23 and the second exchange-coupling functional gap layer 24 with such configuration. Further, even if coupling intensity functioning between the first shield layer 3 and the first gap adjustment layer 232A, between the second gap adjustment layer 232B and the first ferromagnetic layer 21, between the second ferromagnetic layer 22 and the first gap adjustment layer 242A and between the second gap adjustment layer 242B and the second shield layer 4 is comparatively weak, respectively, it becomes possible to certainly have a function as a gap layer.

Adjustment of Intensity of Magnetic Coupling (Intensity of Exchange-Coupling Magnetic Field)

Adjustment of the intensity of the magnetic coupling (intensity of exchange coupling magnetic field) is explained with reference to FIG. 10 and FIG. 11.

Figure 10:
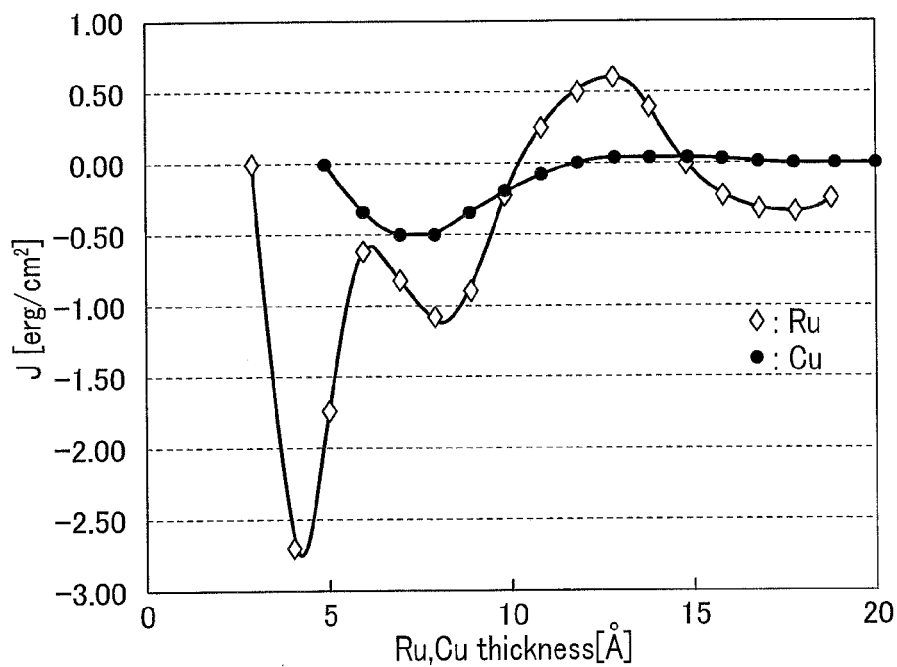
FIG. 10 is a graph showing a relationship between thickness t (Å (angstrom)) of Ru or Cu and intensity of an exchange-coupling magnetic field J ($erg/cm^2$) when Ru or Cu is used as a constituent material of an exchange-coupling transmitting layer and an exchange-coupling adjustment layer of a first exchange-coupling functional gap layer and a second exchange-coupling functional gap layer in one embodiment of the present invention, respectively.

FIG. 10 is a graph showing a relationship between thickness t of Ru or Cu (Å (angstrom)) and the intensity of the exchange-coupling magnetic field J (erg/cm$^2$) when Ru or Cu is used as a constituent material of the exchange-coupling transmitting layers 231 and 241 and the exchange-coupling adjustment layers 233 and 243. Furthermore, in this graph, as a magnetic material that is exchange-coupled by interposing Ru or Cu, a $Co_{90}Fe_{10}$ alloy is used. FIG. 11 is a graph showing a relationship between Cu thickness t (Å (angstrom)) and the intensity of the exchange-coupling magnetic field J (erg/cm$^2$), and basically is substantially the same as the graph regarding Cu shown in FIG. 10, but particularly displaying so as to facilitate the understanding of the fluctuation in the perpendicular axis by expanding the scale span of the intensity of the exchange-coupling magnetic field J (erg/cm$^2$) indicated with the perpendicular axis.

Figure 11:
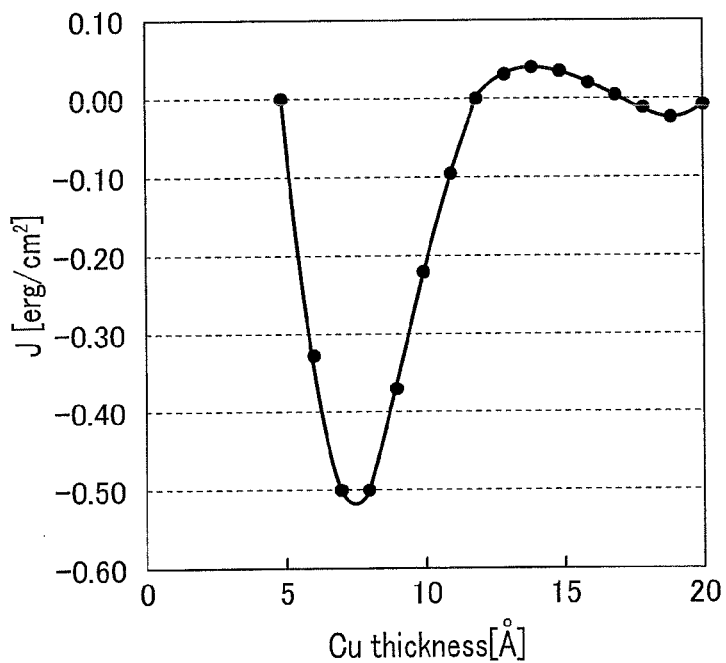
FIG. 11 is a graph showing a relationship between the Cu thickness t (Å (angstrom)) and the intensity of exchange-coupling magnetic field J ($erg/cm^2$) out of the graph shown in FIG. 10.

In the graphs of FIG. 10 and FIG. 11, when a value for the intensity of the exchange-coupling magnetic field J (erg/cm$^2$) becomes plus (+), so-called ferromagnetic coupling (magnetic coupling where magnetizations are orientated toward the same direction) is generated. In the meantime, when a value for f the intensity of the exchange-coupling magnetic field J (erg/cm$^2$) becomes minus (−), so-called antiferromagnetic coupling (magnetic coupling where magnetizations are orientated toward the opposite directions) is generated. Furthermore, an absolute value |J| of the exchange-coupling magnetic field J (erg/cm$^2$) indicates an absolute value of the coupling intensity itself.

The exchange-coupling transmitting layers 231 and 241 are preferably designed such that the absolute value |J| for the intensity of the exchange-coupling magnetic field J (erg/cm$^2$) exceeds 0.2 (erg/cm$^2$) (|J|>0.2 (erg/cm$^2$)). If the absolute value |J| for the intensity of the exchange-coupling magnetic field J (erg/cm$^2$) is 0.2 (erg/cm$^2$) or less, the magnetizations 21a and 22a of the first ferromagnetic layer 21 and the second ferromagnetic layer 22 is not likely to be able to be orientated toward the desired direction, respectively.

From such point of view, in the present embodiment, as it is clear from the graphs shown in FIGS. 10 and FIG. 11, when Cu is used as a material composing the exchange-coupling transmitting layers 231 and 241, it is preferable to set the thickness of the exchange-coupling transmitting layers 231 and 241 within the range of 6 Å and 10 Å, and when Ru is used, it is preferable to set the thickness of the exchange-coupling transmitting layers 231 and 241 within the ranges of 4 Å and 9 Å and 16 Å to 20 Å.

In the meantime, the exchange-coupling adjustment layers 233 and 243 are preferably designed such that the absolute value |J| for the intensity of the exchange coupling magnetic field J (erg/cm$^2$) is greater than 0.02 (erg/cm$^2$) and less than 0.6 (erg/cm$^2$) (0.02 erg/cm$^2$<|J|<0.6 erg/cm$^2$). If the absolute value |J| for the intensity of the exchange coupling magnetic field J (erg/cm$^2$) is 0.02 (erg/cm$^2$) or less, the magnetization states of the first ferromagnetic layer 21 and the second ferromagnetic layer 22 functioning as a so-called free layer are liked to become a multiple magnetic domain and to generate Barkhausen noise. In the meantime, if absolute value |J| for the intensity of the exchange coupling magnetic field J (erg/cm$^2$) is 0.6 (erg/cm$^2$) or greater, it becomes difficult for the magnetization of the first ferromagnetic layer 21 and the second ferromagnetic layer 22 functioning as a so-called free layer to freely respond to a signal magnetic field from a medium, and this is likely to lead to low sensitivity.

From such point of view, in the present embodiment, as it is clear from the graphs shown in FIG. 10 and FIG. 11, when Cu is used as a material composing the exchange-coupling adjustment layers 233 and 243, it is preferable to set the thickness of the exchange-coupling adjustment layers 233 and 243 within the range of 13 Å to 16 Å, and when Ru is used, it is preferable to set the thickness within the range of 9.5 Å to 20 Å.

Furthermore, even when Rh, Ir, Cu, Ag, Au, Pt or Pd is used as the constituent material of the exchange-coupling transmitting layers 231 and 241 and the exchange-coupling adjustment layers 233 and 243, the thickness of those can be set as similar to Ru and Cu.

First Antiferromagnetic Layer and Second Antiferromagnetic Layer

The first antiferromagnetic layer 5 and the second antiferromagnetic layer 6 formed adjacent to the first shield layer 3 and the second shield layer 4, respectively, fulfill a function to secure the magnetization directions of the first shield layer 3 and the second shield layer 4 by exchange-coupling of the first shield layer 3 and the second shield layer 4, respectively.

As a material composing the first antiferromagnetic layer 5 and the second antiferromagnetic layer 6, for example, an antiferromagnetic material containing at least one type of element selected from a group of Pt, Ru, Rh, Pd, Ni, Cu, Ir, Cr and Fe, and Mn can be used. The content of Mn in this antiferromagnetic is preferably 35 to 95 atomic percent.

The first antiferromagnetic layer 5 is configured so as to present lower blocking temperature ($Tb_5$) than the blocking temperature ($Tb_6$) of the second antiferromagnetic layer 6. The magnetizations 3a and 4a of the first shield layer 3 and the second shield layer 4 can be secured in the state where they are substantially orthogonalized with each other because the blocking temperatures of the first antiferromagnetic layer 5 and the second antiferromagnetic layer 6 have such relationship ($Tb_5$<$Tb_6$), and, the MR element 1 is manufactured using a method described later.

For example, the blocking temperature ($Tb_5$) of the first antiferromagnetic layer 5 can be lower than that ($Tb_6$) of the second antiferromagnetic layer 6 by reduction of the thickness (Z direction) of the first antiferromagnetic layer 5 compared to that (Z direction) of the second antiferromagnetic layer 6. Preferably, the thickness of the first antiferromagnetic layer 5 can be set within the range of 30 Å to 70 Å, and that of the second antiferromagnetic layer 6 can be set within the range of 80 Å to 200 Å.

Among the antiferromagnetic materials, there are non-heat treatment type antiferromagnetic materials that does not require any heat treatment but indicate antiferromagnetization and induces the exchange-coupling magnetic field in between the ferromagnetic materials, and, heat treatment type antiferromagnetic materials that indicate antiferromagnetization by a heat treatment. In the present embodiment, any type of antiferromagnetic materials can be used as materials composing the first antiferromagnetic layer 5 and the second antiferromagnetic layer 6. As the non-heat treatment type antiferromagnetic materials, RuRhMn, FeMn and IrMn are exemplified, and as the heat treatment type antiferromagnetic materials, PtMn, NiMn and PtRhMn can be exemplified.

[Operation to Detect External Magnetic Field by MR Element]

Figure 12A:
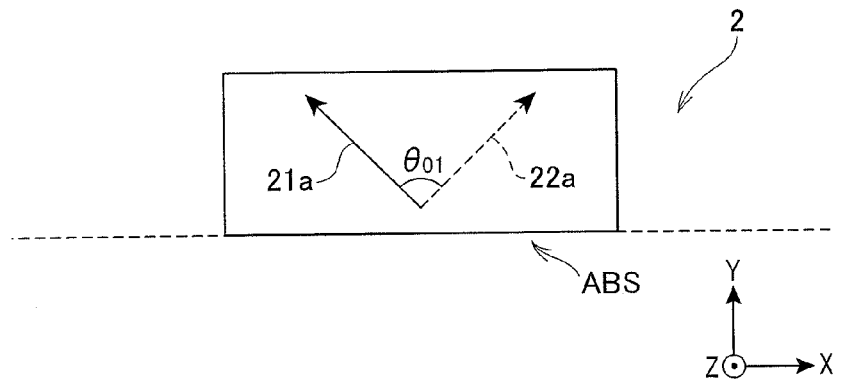
FIGS. 12A to 12C are model diagrams showing a state change of magnetization enabling to obtain a magnetoresistive effect in the MR element relating to one embodiment of the present invention according to the external magnetic field, respectively.
Figure 12B:
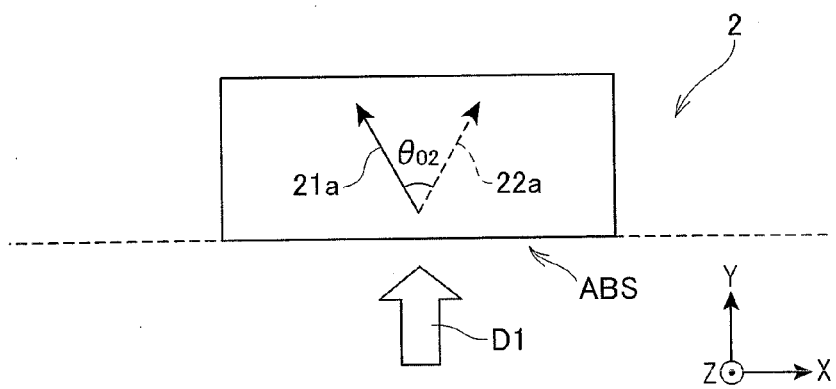
Figure 12C:
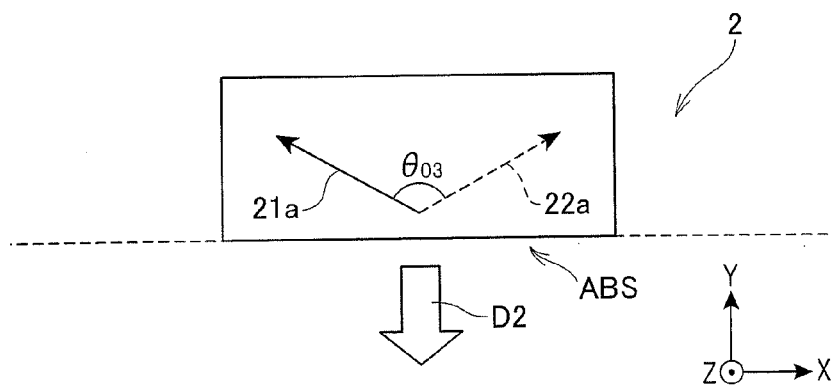

With reference to FIGS. 12A to 12C, the operation to detect an external magnetic field by the MR element 1 relating to the present embodiment is explained.

As described above, the magnetizations 21*a* and 22*a* of the first ferromagnetic layer 21 and the second ferromagnetic layer 22 are substantially orthogonalized with each other by indirectly and magnetically coupling the first ferromagnetic layer 21 and the second ferromagnetic layer 22 with the first shield layer 3 and the second shield layer where the magnetizations 3*a* and 4*a* are substantially orthogonalized with each other (see FIG. 12A). In other words, an angle $\theta_{01}$ formed by the magnetizations 21*a* and 22*a* is approximately 90 degrees. This state is an initial state as the MR element 1 (MR part 2).

As shown in FIG. 12B, when an external magnetic field D1 flowing into the element side from ABS is detected, the magnetization 21*a* of the first ferromagnetic layer 21 and the magnetization 22*a* of the second ferromagnetic layer 22 tend to be orientated toward the same direction, and the element resistance becomes smaller. In other words, an angle $\theta_{02}$ formed by the magnetizations 21*a* and 22*a* becomes smaller than the angle $\theta_{01}$ in the initial state ($\theta_{01} > \theta_{02}$).

In the meantime, as shown in FIG. 12C, when an external magnetic field D2 in the direction away from ABS is detected, a tendency where the magnetization 21*a* of the first ferromagnetic layer 21 and the magnetization 22*a* of the second ferromagnetic layer 22 are orientated toward the opposite directions in both sides is generated, and the element resistance becomes greater. In other words, an angle $\theta_{03}$ formed by the magnetizations 21*a* and 22*a* becomes greater than the $\theta_{01}$ in the initial state ($\theta_{03} > \theta_{01}$).

The external magnetic field can be detected by measuring a series of resistive changes to such external magnetic field.

[Manufacturing Method for MR Element]

A manufacturing method for the MR element 1 having the configuration above is explained with reference to diagrams. Furthermore, in the present specification, manufacturing steps of the MR element having the configuration shown in FIG. 5 are explained as one example.

FIGS. 13A to 13D are perspective views schematically showing manufacturing steps of the MR element relating to the present embodiment; FIGS. 14A to 14D are perspective views schematically showing a first annealing process and a second annealing process in the manufacturing steps of the MR element relating to the present embodiment; and FIGS. 15A to 15B are cross-sectional views (cross-sectional view at right angles with ABS (cross-sectional views on YZ plane)) schematically showing a step to form a magnetization direction adjustment layer in the manufacturing step of the MR element relating to the present embodiment.

Figure 13A:
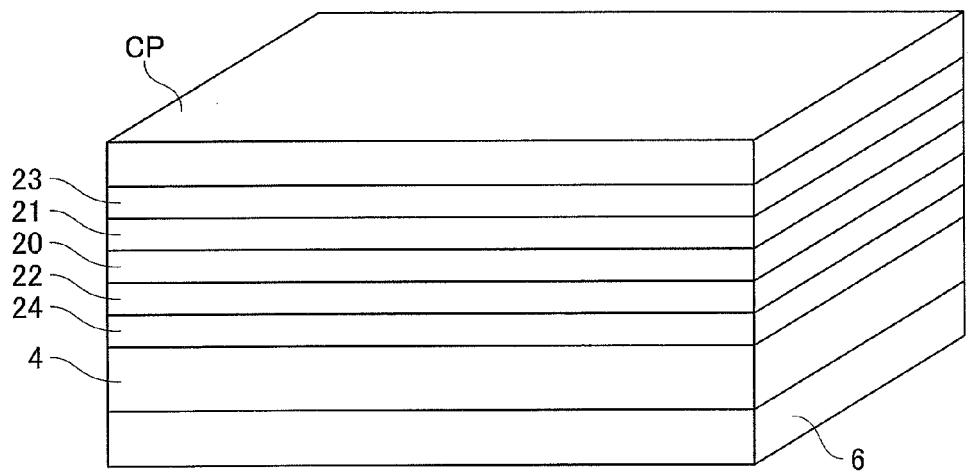
FIGS. 13A to 13D show perspective views schematically showing steps to manufacture the MR element relating to one embodiment of the present invention, respectively.
Figure 13A:
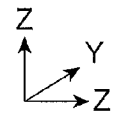
Figure 13B:
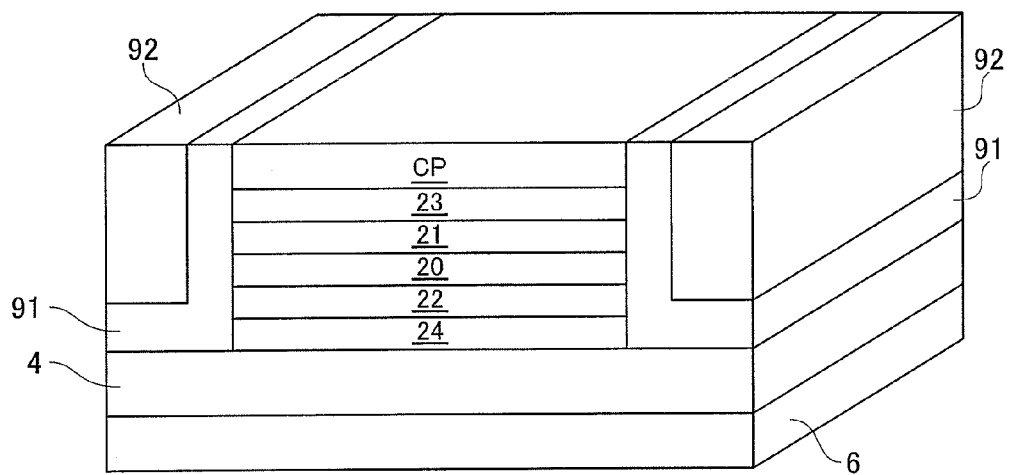
Figure 13B:
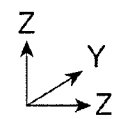
Figure 13C:
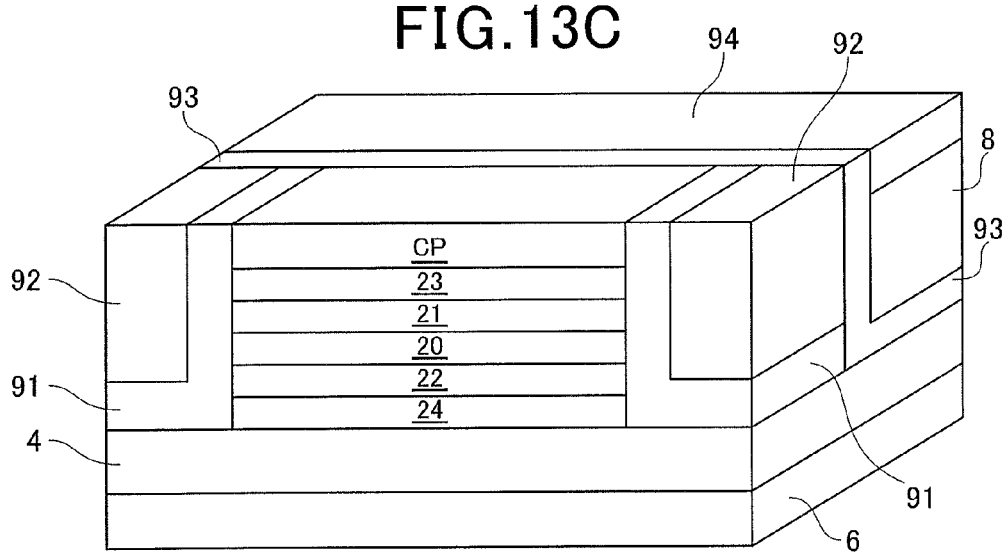
Figure 13C:
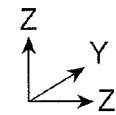

First, the second shield layer 4, the second exchange-coupling functional gap layer 24, the second ferromagnetic layer 22, the nonmagnetic intermediate layer 20, the first ferromagnetic layer 21, the first exchange-coupling functional gap layer 23 and a TMR cap layer CP are formed on the second antiferromagnetic layer 6 by laminating in respective order (see FIG. 13A). Each layer of these (each layer from the second antiferromagnetic layer 6 to the TMR cap layer CP) can be formed, for example, using a pattern plating method or a sputtering method including a frame plating method.

Figure 14A:
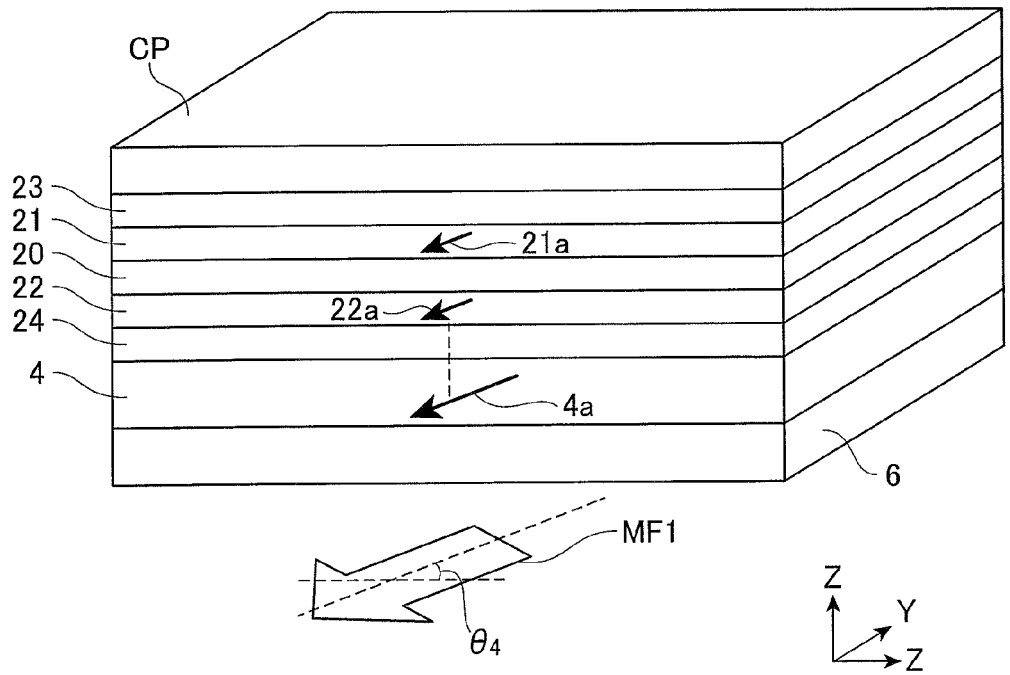
FIGS. 14A to 14D show perspective views schematically showing annealing process steps (a first annealing process step and a second annealing process step) out of the steps to manufacture the MR element relating to one embodiment of the present invention, respectively.
Figure 14B:
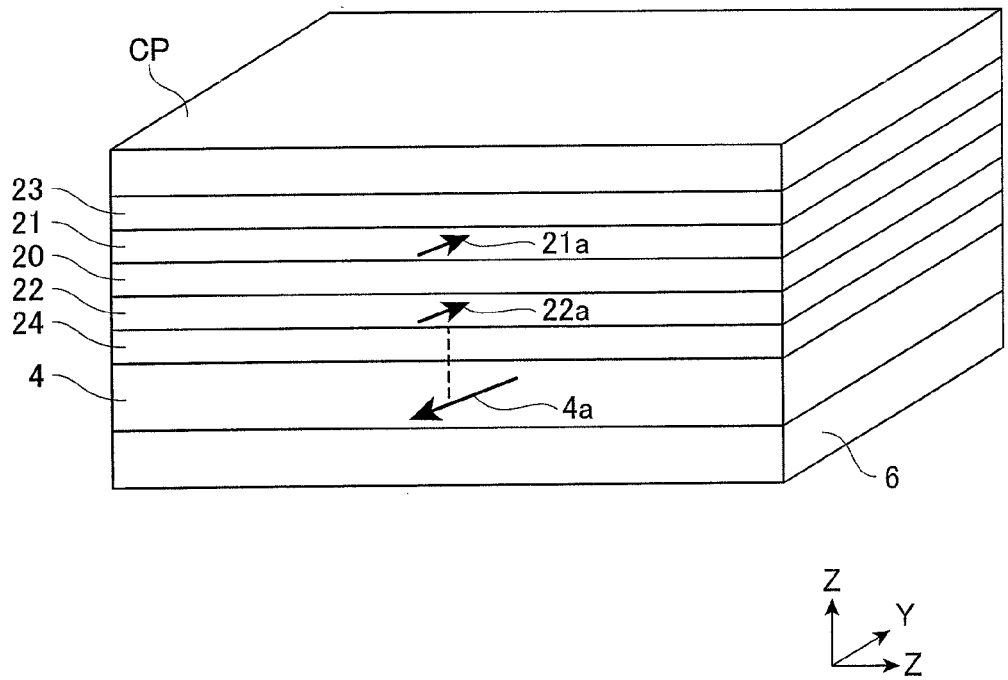
Figure 15A:
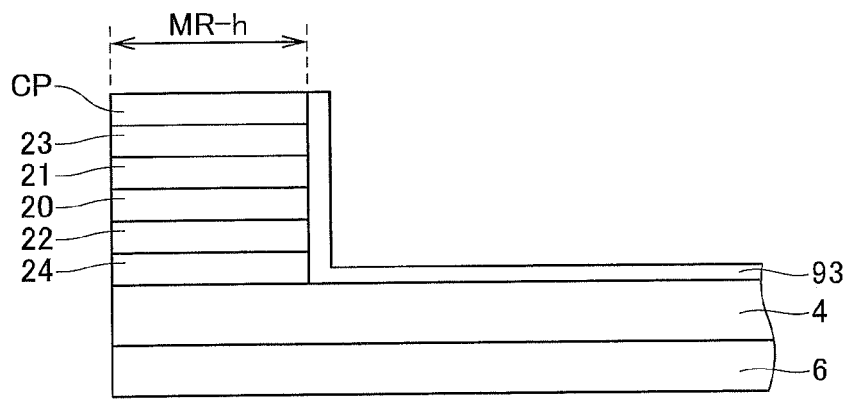
FIGS. 15A to 15B show cross-sectional views on a plane that is orthogonal to ABS, schematically showing a step to form a magnetization direction adjustment layer in manufacturing steps of the magnetoresistive effect element relating to one embodiment of the present invention, respectively.
Figure 15B:
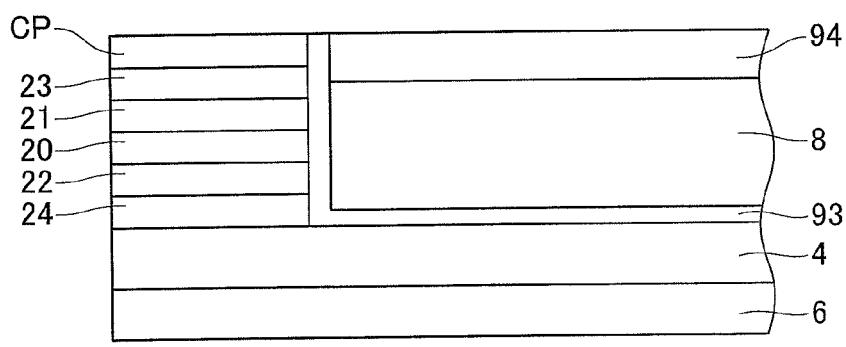

Next, while the annealing process is applied to the multilayer body (multilayer body shown in FIG. 13A) formed as mentioned above, a magnetic field MF1 is applied to a predetermined direction (direction at a predetermined angle $\theta_4$ with regard to the track width direction) (first annealing process, see FIG. 14A). In the example shown in FIG. 14A, this is the direction from the right back side toward the left front side viewing from the ABS side, and the magnetic field MF1 is applied to the direction at approximately 45° of angle with regard to the ABS.

At this time, the annealing temperature T1 shall be higher than the blocking temperature ($Tb_6$) of the second antiferromagnetic layer 6 ($T1 > Tb_6$). Because the annealing temperature T1 is set at higher temperature than the blocking temperature ($Tb_6$) of the second antiferromagnetic layer 6, the magnetization 4*a* of the second shield layer 4 on the second antiferromagnetic layer 6 can be orientated toward the direction of the magnetic field MF1. In the meantime, for the annealing temperature T1, its upper limit value can be appropriately set according to the constituent material of each layer (particularly the second shield layer 4) as long as it is higher than the blocking temperature ($Tb_6$) of the second antiferromagnetic layer 6, and it is preferably less than 300° C. When NiFe is used as a material composing the second shield layer 4, if the annealing temperature T1 exceeds 300° C., roughness of the second shield layer 4 may be deteriorated.

In the first annealing process, the intensity of the magnetic field MF1 to be applied to the multilayer body (the multilayer shown in FIG. 13A) is not particularly limited as long as it is a sufficient magnetic field to saturate the magnetization 4*a* of the second shield layer 4 in the direction of the magnetic field MF1, and for example, it can be set to approximately 3 kOe.

After the magnetic field MF1 is applied while the annealing process is applied as mentioned above, and after the magnetization 4*a* of the second shield layer 4 is saturated in the direction of the magnetic field MF1, the temperature of the multilayer body (the multilayer body shown in FIG. 13A) is reduced. If the temperature of the multilayer body (the multilayer body shown in FIG. 13A) becomes lower than the blocking temperature ($Tb_6$) of the second antiferromagnetic layer 6, the direction of the magnetization 4*a* of the second shield layer 4 is secured to the direction of the magnetic field MF1. Further, when the second shield layer 4 and the second ferromagnetic layer 22 are indirectly and antiferromagnetically magnetically coupled via the second exchange-coupling functional gap layer 24, the direction of the magnetization 22*a* of the second ferromagnetic layer 22 becomes in the antiparallel state with the direction of the magnetization 4*a* of the second shield layer 4 (see FIG. 14B).

Next, a photoresist film is formed so as to cover the TMR cap layer CP and is patterned, and a portion where the photoresist film does not exist (both side portions in the track width direction viewing from the ABS) is etched with the residual photoresist film as a mask using a dry etching method, such as ion milling, until the upper surface of the second shield layer 4 is exposed. Then, an insulating layer 91 made of $Al_2O_3$ or MgO is formed in the portion, which is removed by etching, using, for example, the sputtering method, and a refill layer 92 made of a nonmagnetic material, such as Ru or $SiO_2$, or a magnetic material, such as NiFe or CoFe, is formed (see FIG. 13B). With this step, the track width of the MR part 2 is defined.

Subsequently, a photoresist film is formed so as to cover the TMR cap layer CP, the insulating layer 91 and the refill layer 92 and is patterned, and a portion where the photoresist film does not exist (a back side portion from the ABS in the multilayer body from the second exchange-coupling functional gap layer to the TMR cap layer CP) is etched with the residual photoresist film as a mask using the dry etching method, such as ion milling, until the upper surface of the second shield layer 4 becomes exposed. Then, the insulating layer 93 made of $Al_2O_3$ is formed in the portion that is removed by etching (see FIG. 15A). That way, the height (MR height (MR-h)) in the perpendicular direction (Y direction) to the ABS in the MR part 2 is defined.

Figure 13D:
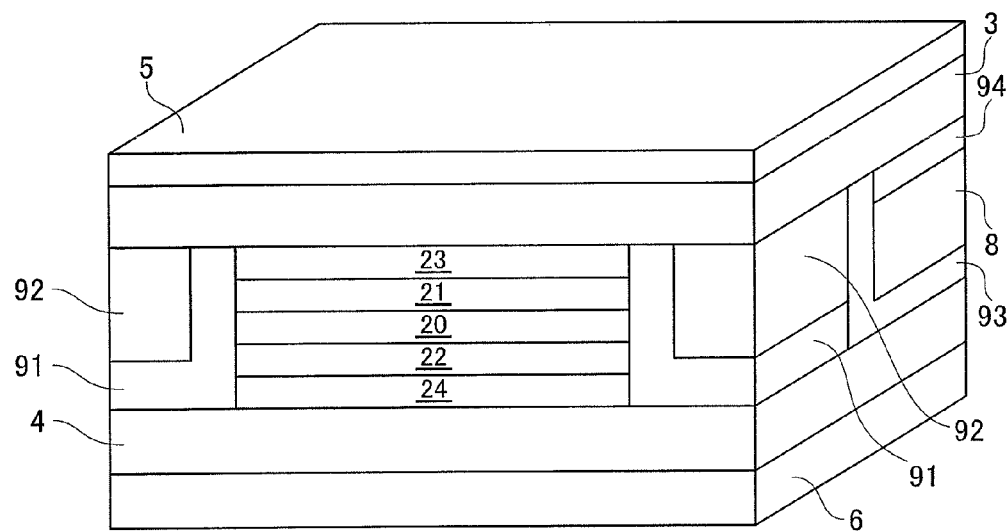
Figure 13D:
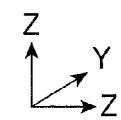

Then, the magnetization direction adjustment layer 8 composed of a magnetic body, such as NiFe or CoFe, and a nonmagnetic layer 94 made of $Al_2O_3$ or Cr are formed on the insulating layer 93 at the back side portion from the ABS in the multilayer body from the second exchange-coupling functional gap layer 24 to the TMR cap layer CP (see FIGS. 13C and 15B); they are planarized using a dry etching method and the upper surface of the first exchange-coupling functional gap layer 23 is exposed; and the first shield layer 3 and the first antiferromagnetic layer 5 are formed on the first exchange-coupling functional gap layer 23 and the magnetization direction adjustment layer 8, by lamination in respective order (see FIG. 13D).

Figure 14C:
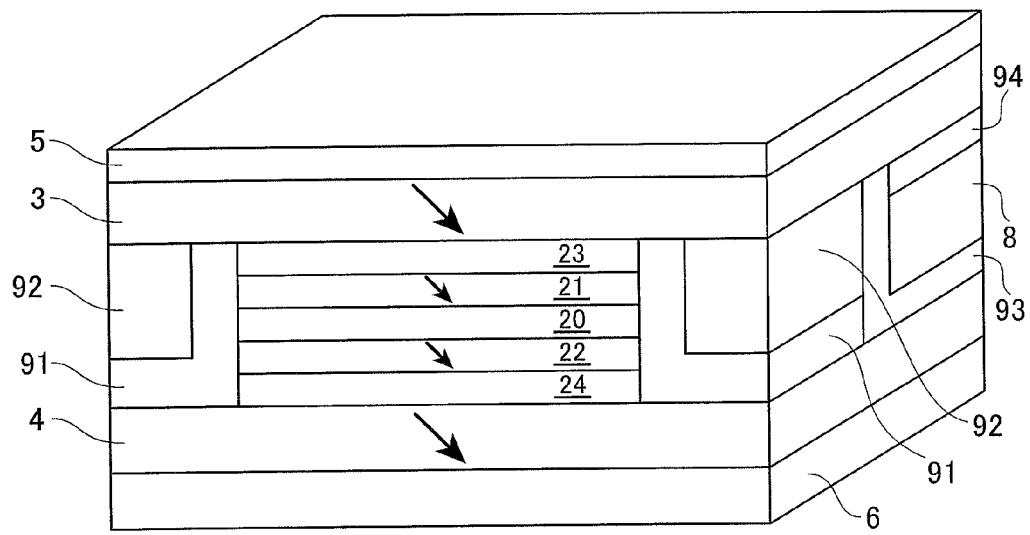
Figure 14C:
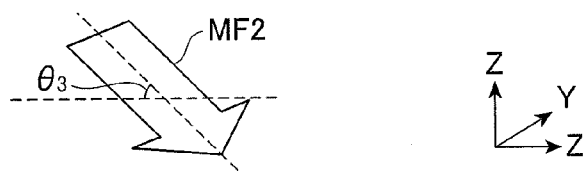
Figure 14D:
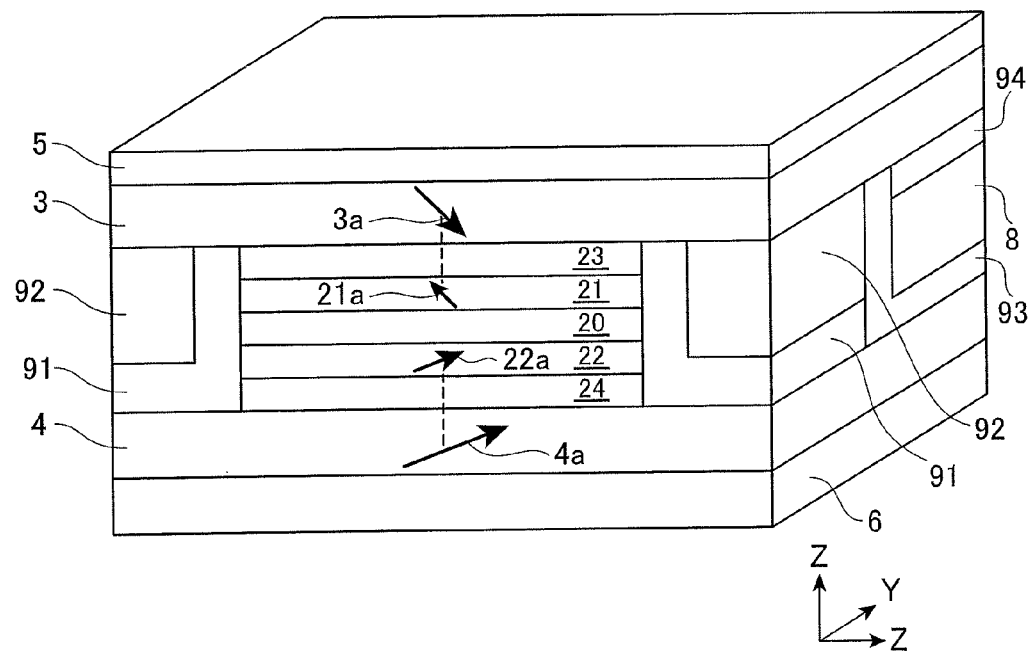

While the annealing process is applied to the multilayer body (the multilayer body shown in FIG. 13D) formed as mentioned above, a magnetic field MF2 is applied to a predetermined direction (the direction at a predetermined angle $\theta_3$ with regard to the track width direction, and the direction that is substantially orthogonalized with the direction of the magnetization 4a of the second shield layer 4) (second annealing process, see FIG. 14C). In the example shown in FIG. 14C, this is the direction from the left back side toward the right front viewing from the ABS side, and the magnetic field MF2 is applied to the direction at the angle of approximately 45° with regard to the ABS.

At this time, the annealing temperature T2 is set at less than the blocking temperature ($Tb_6$) of the second antiferromagnetic layer 6, and, at higher than the blocking temperature ($Tb_5$) of the first antiferromagnetic layer 5 ($Tb_5 < T2 < Tb_6$). The magnetization 3a of the first shield layer 3 under the first antiferromagnetic layer 5 can be orientated toward the direction of the magnetic field MF2 by setting the annealing temperature T2 at higher than the blocking temperature ($Tb_5$) of the first antiferromagnetic layer 5. In the meantime, if the annealing temperature T2 exceeds the blocking temperature ($Tb_6$) of the second antiferromagnetic layer 6, the magnetization direction of the second shield layer 4 secured in the direction of the predetermined angle $\theta_4$ shall be secured to the direction of the magnetic field MF2 in the second annealing process, and the directions of the magnetizations 3a and 4a of the first shield layer 3 and the second shield layer 4 is not likely to be able to be substantially orthogonalized. Consequently, the direction of the magnetization 4a of the second shield layer 4 after the second annealing process can be secured to the direction of the predetermined angle $\theta_4$ by setting the annealing temperature T2 at less than the blocking temperature ($Tb_6$) of the second antiferromagnetic layer 6.

The intensity of the magnetic field MF2 to be applied to the multilayer body (the multilayer body shown in FIG. 13D) in the second annealing process is not particularly restricted as long as this is a sufficient magnetic field to saturate the magnetization 3a of the first shield layer 3 to the direction of the magnetic field MF2, and for example, it can be set at approximately 3 kOe.

Thus, while the second annealing process is applied, the magnetic field MF2 is applied, and after the magnetization 3a of the first shield layer 3 is saturated to the direction of the magnetic field MF2, the temperature of the multilayer body (the multilayer body shown in FIG. 13D) is reduced. If the temperature of the multilayer body (the multilayer body shown in FIG. 13D) becomes the blocking temperature ($Tb_5$) or less of the first antiferromagnetic layer 5, the direction of the magnetization 3a of the first shield layer 3 is secured to that of the magnetic field MF2. Along with this, if the first shield layer 3 and the first ferromagnetic layer 21 are indirectly and antiferromagnetically magnetically coupled via the first exchange-coupling functional gap layer 23, the direction of the magnetization 21a of the first ferromagnetic layer 21 is in the antiparallel state relative the direction of the magnetization 3a of the first shield layer 3 (see FIG. 14D).

Thus, before the first shield layer 3 is formed, the direction of the magnetization 4a of the second shield layer 4 can be secured to the direction of the predetermined angle $\theta_4$ by the first annealing process that applies heating while the magnetic field MF1 is applied to the direction of the predetermined angle $\theta_4$. Then, the first shield layer 3 is formed, and the direction of the magnetization 3a of the first shield layer 3 can be secured to the direction of the predetermined angle $\theta_3$ by the second annealing process that applies heating while the magnetic field MF2 is applied to the direction of the predetermined angle $\theta_3$. Because the annealing temperature T2 in this second annealing process is less than the blocking temperature ($Tb_6$) of the second antiferromagnetic layer 6 securing the magnetization 4a of the second shield layer 4, the direction of the magnetization 4a of the second shield layer 4 after the second annealing process shall be the direction secured by the first annealing process. Consequently, the magnetizations 3a and 4a of the first shield layer 3 and the second shield layer 4 can be substantially orthogonalized with each other. Then, the magnetizations 21a and 22a of the first ferromagnetic layer 21 and the second ferromagnetic layer 22 are in the antiparallel state with the magnetizations 3a and 4a when they are indirectly and antiferromagnetically magnetically coupled with the first shield layer 3 and the second shield layer 4, respectively. Then, because the antiferromagnetic field that acts on between the first ferromagnetic layer 21 and the second ferromagnetic layer 22 is absorbed by the magnetization direction adjustment layer 8 positioned rearward (at the depth side of) those, as a result, the magnetizations 21a and 22a of the first ferromagnetic layer 21 and the second ferromagnetic layer 22 can be substantially orthogonalized.

According to the MR element 1 relating to the present embodiment manufactured as described above, even if the bias magnetic field application part made of a hard magnetic body or magnet for applying the bias magnetic field to the first ferromagnetic layer 21 and the second ferromagnetic layer 22 does not exist, the magnetizations 21a and 22a of the first ferromagnetic layer 21 and the second ferromagnetic layer 22 can be substantially orthogonalized, i.e., be in the initial state.

[Thin Film Magnetic Head]

Figure 16:
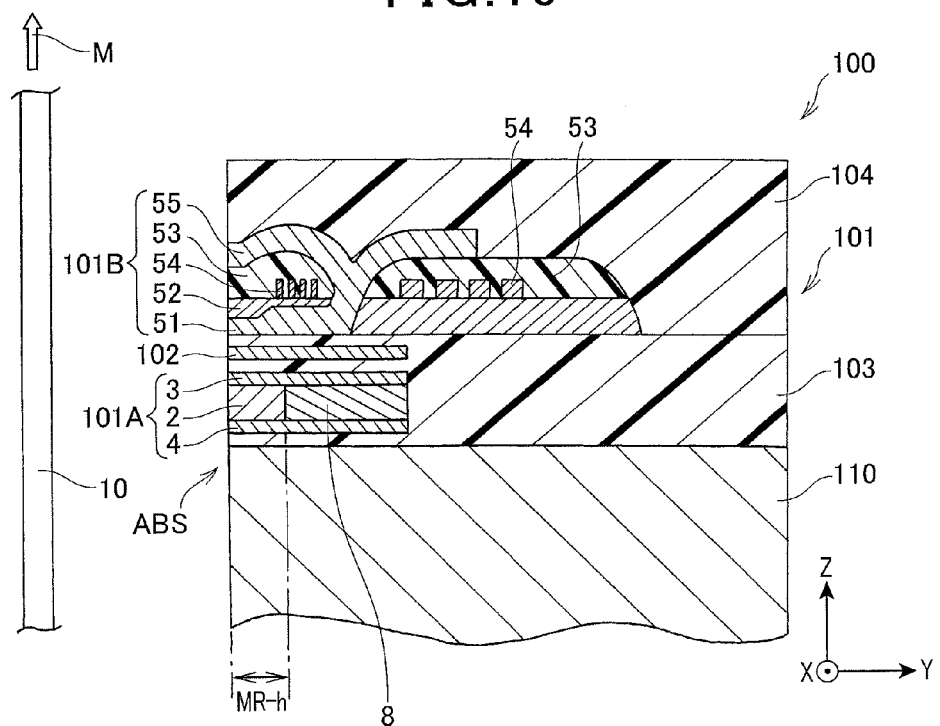
FIG. 16 is a cross-sectional view on a plane that is orthogonal to ABS, schematically showing a configuration of the thin film magnetic head in one embodiment of the present invention.

Next, the overall structure of the thin film magnetic head in the present embodiment is explained with reference to FIG. 16. FIG. 16 is a cross-sectional view (cross-sectional view on YZ plane) perpendicular to the ABS in the thin film magnetic head in the present embodiment.

As shown in FIG. 16, in order to apply a magnetic process to a recording medium, such as a hard disk, that moves in a medium travelling direction M, a thin film magnetic head 100 is mounted in a magnetic recording apparatus, such as a hard disk drive, and is used.

The thin film magnetic head 100 shown in FIG. 16 is a so-called composite type head that can execute both the recording process and the reproducing process as a magnetic process. In the thin film magnetic head 100, a magnetic head part 101 is formed on a slider substrate 110 made of a ceramic material, such as AlTiC ($Al_2O_3$.TiC).

The magnetic head part 101 has a configuration where a reproducing head part 101A that performs process to reproduce recorded magnetic information and a shield type recording head part 101B that performs perpendicular recording system recording process are laminated in respective order by utilizing the magneto-resistive (MR) effect.

The reproducing head part 101A is configured with the MR element 1 relating to the present embodiment having the lamination structure where the second shield layer 4, the MR part 2 and the first shield layer 3 are laminated in respective order (see FIGS. 1 to 12). Furthermore, the second shield layer 4, the MR part 2 and the first shield layer 3 form one portion of the ABS. Then, the height in the perpendicular direction (Y direction) with regard to the ABS in the MR part 2 becomes MR height (MR-h).

An interelement shield layer 102 made of the similar material to the first shield layer 3 is formed between the first shield layer 3 and the recording head part 101B.

The interelement shield layer 102 fulfills a role to cut off the MR part 2 functioning as a sensor from a magnetic field generated from the recording head part 101B, and to prevent exogenous noise on the occasion of reading. Further, a bucking coil part may be further formed between the interelement shield layer 102 and the recording head part 101B. The bucking coil part is to generate a magnetic flux for overriding a magnetic flux loop via upper and lower electrode layers of the MR part 2, and functions so as to suppress unnecessary writing into the recording medium or a wide area adjacent track erasure (WATE) phenomenon, which is an erasure action.

An insulating layer 103 made of alumina is formed at a space between the first shield layer 3 and the second shield layer 4, which are at the opposite side from the ABS of the MR part 2, a back side site, which is at the opposite side from the ABS of the first shield layer 3, the second shield layer 4 and the interelement shield layer 102; a space between the second shield layer 4 and the slider substrate 110; and a space between the interelement shield layer 102 and the recording head part 101B, respectively.

The recording head part 101B is preferably configured for perpendicular magnet recording, and as shown in FIG. 16, has a main magnetic pole layer 51, a gap 52, a coil insulating layer 53, a coil layer 54 and an auxiliary magnetic pole layer 55.

The main magnetic pole layer 51 is configured as a magnetic guide path that guides a magnetic flux induced by the coil layer 54 while focusing to a recording layer of the recording medium 10 where writing is recorded. Herein, at the end part of the ABS of the main magnetic pole layer 51, it is preferable to set the width in the track width direction (X direction in FIG. 16) and the thickness in the lamination direction (Z direction in FIG. 16) smaller than other portions. With this design, it becomes possible to generate a minute and strong magnetic field for writing corresponding to the high recording density.

The ABS-side end part of the auxiliary magnetic pole layer 55 that is magnetically coupled with the main magnetic pole layer 51 forms a trailing shield part. As shown in FIG. 16, the auxiliary magnetic pole layer 55 is placed opposite from the end part of the main magnetic pole part 51 at the ABS side by having the gap layer 52 and the coil insulating layer 53 made of an insulating material, such as alumina, intervened.

A magnetic field gradient can be further precipitous between the auxiliary magnetic pole layer 55 and the main magnetic pole layer 51 in the vicinity of the ABS by placing such auxiliary magnetic pole layer 55. With this design, signal output jitter becomes smaller and an error rate upon writing can be smaller.

The auxiliary magnetic pole layer 55 is formed, for example, at approximately 0.5 μm to 5 μm of thickness using, for example, a frame plating method and a sputtering method. As a material composing the auxiliary magnetic pole layer 55, for example, an alloy of either two or three of Ni, Fe and Co and an alloy where a predetermined element(s) is added containing these as principal elements can be exemplified.

The gap layer 52 is formed so as to separate from the coil layer 54 and the main magnetic pole layer 51. The gap layer 52 is made of $Al_2O_3$ or diamond-like carbon (DLC) with approximately 0.01 um to 0.5 um of thickness which is formed using, for example, a sputtering method or a CVD method.

An insulating layer 104 made of alumina is formed so as to cover the periphery of the recording head part 101B.

[Head Gimbal Assembly (HGA) and Hard Disk Apparatus]

Subsequently, an HGA where the thin film magnetic head 100 in the present embodiment is mounted and used, and a hard disk apparatus are explained.

First, a slider 310 contained in the HGA is explained with reference to FIG. 17. In the hard disk apparatus, the slider 310 is arranged so as to oppose against a hard disk, which is a disk recording medium that is rotated and driven. This slider 310 includes a base substrate mainly composed with a substrate and overcoat.

The base substrate 311 substantially forms a hexahedron. One surface out of six surfaces in the base substrate 311 is designed to be opposite from the hard disk. The ABS is formed on this surface.

Figure 17:
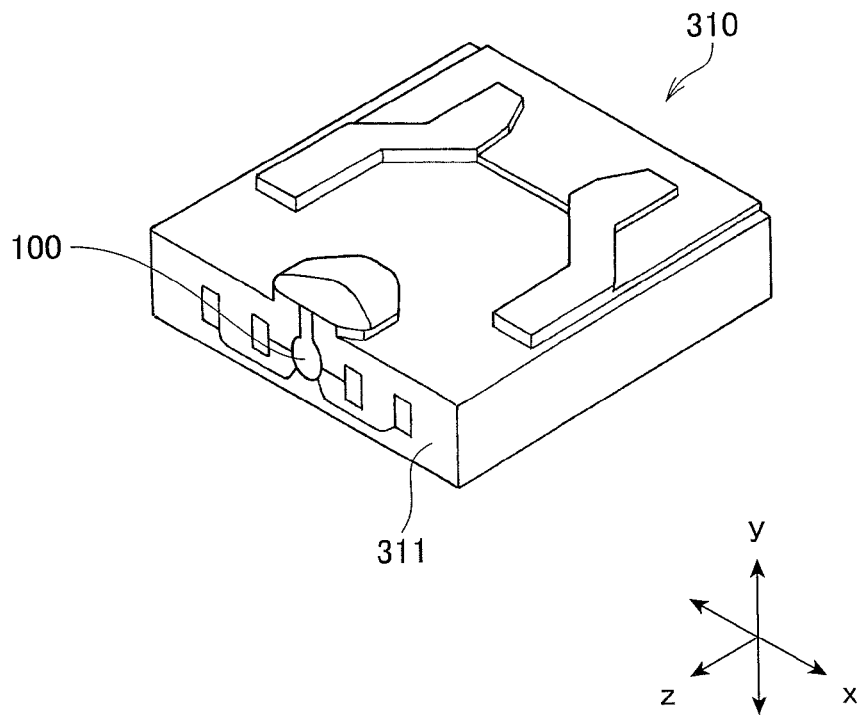
FIG. 17 is a perspective view showing a slider included in the HGA in one embodiment of the present invention.

When the hard disk rotates in the z direction in FIG. 17, lifting force is generated downward in the y direction in FIG. 17 in the slider 310 due to an air flow that passes through between the hard disk and the slider 310. The slider 310 is designed to float from the surface of the hard disk due to this lifting force. Furthermore, the x direction in FIG. 17 is the track width direction of the hard disk.

The thin film magnetic head 100 in the present embodiment is formed in the vicinity of the end part of the slider at the air flow side (lower-left end part in FIG. 17).

Next, an HGA 320 in the present embodiment is explained with reference to FIG. 18. The HGA 320 includes the slider 310 and a suspension 321 that elastically supports this slider 310. The suspension 321 has a plate spring-state load beam 322 made from stainless steel; a flexure 323 that is placed at one end part of this load beam 322, and, where the slider 310 is joined, and that provides an approximate degree of freedom to the slider 310; and a base plate 324 that is placed at the other end part of the load beam 322.

The base plate 324 is designed to be mounted to an arm 330 of an actuator for moving the slider 310 in the track crossing direction x of the hard disk 362. The actuator has the arm 330 and a voice coil motor that drives this arm 330. In the flexure 323, a gimbal part for maintaining the posture of the slider 310 constantly is placed in a portion where the slider 310 is mounted.

The HGA 320 is mounted at the arm 300 of the actuator. A member where the HGA 320 is mounted at one arm 330 is referred to as a head arm assembly. Further, a member where the HGA 320 is mounted in each arm of a carriage having a plurality of arms is referred to as head stack assembly.

Figure 18:
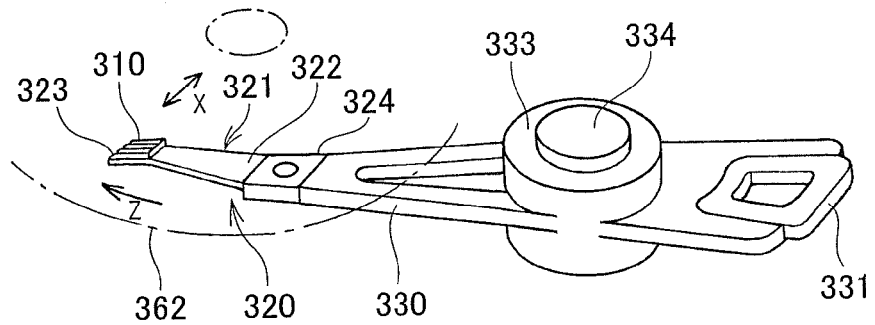
FIG. 18 is a perspective view showing a head arm assembly including the HGA in one embodiment of the present invention.

FIG. 18 shows one example of the head arm assembly. In this head arm assembly, the HGA 320 is mounted at one end part of the arm 330. A coil 331 to be a part of the voice coil motor is mounted at the other end part of the arm 330. A bearing part 333 that is mounted to an axis 334 for supporting the arm 330 to be turnable is placed in the intermediate part of the arm 330.

Figure 19:
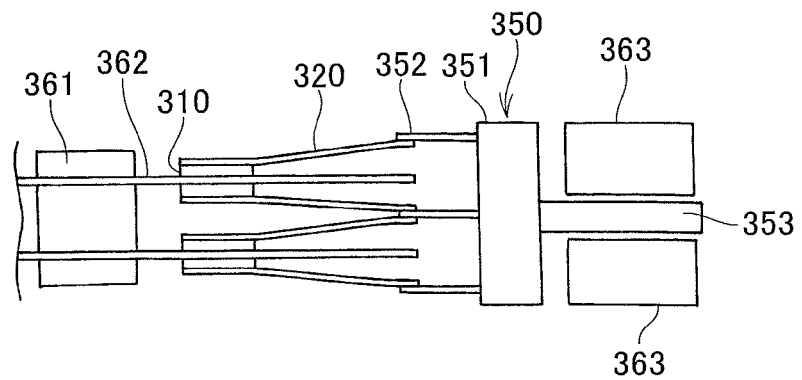
FIG. 19 is an explanatory diagram showing a principal part of a hard disk apparatus in one embodiment of the present invention.
Figure 20:
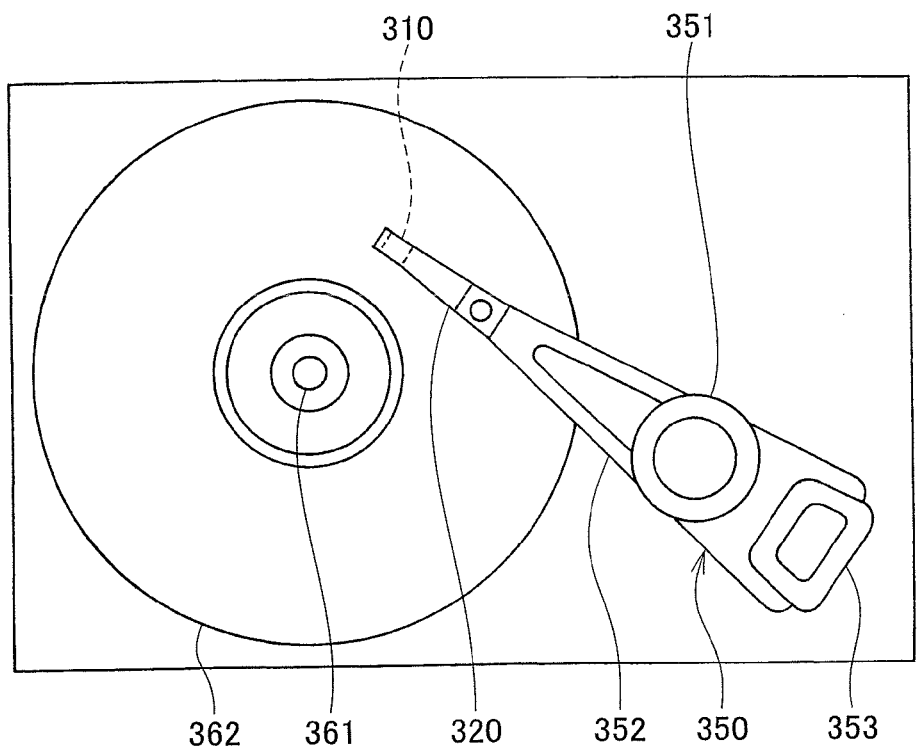
FIG. 20 is a plan view showing a hard disk apparatus in one embodiment of the present invention.
Figure 21:
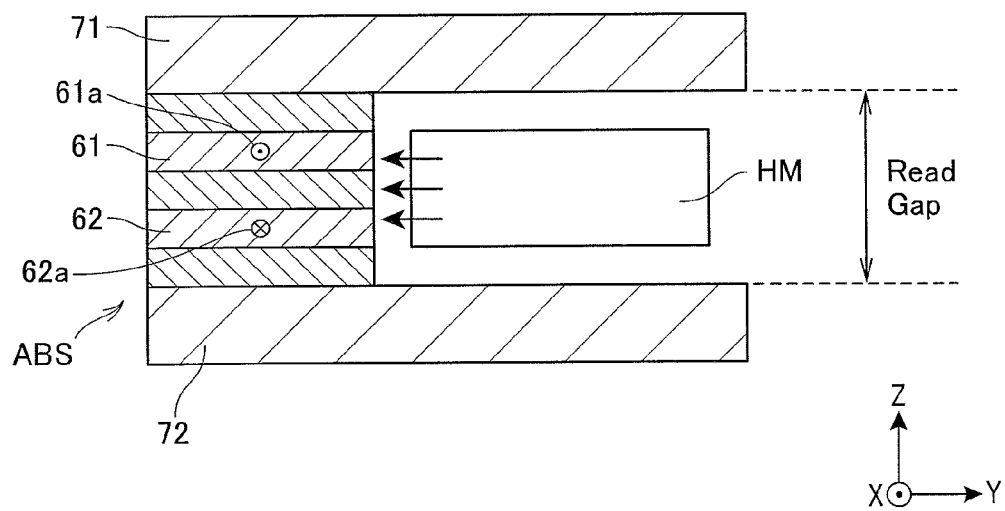
FIG. 21 is a cross-sectional view on a plane that is orthogonal to ABS, schematically showing the MR element of prior art.
Figure 22:
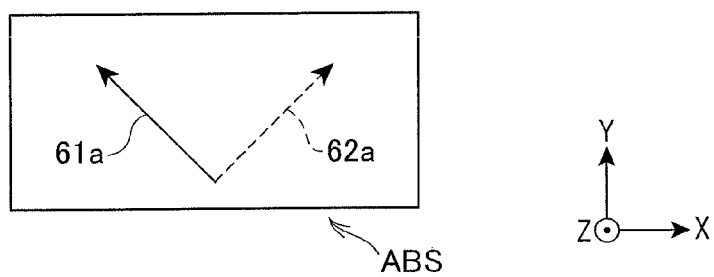
FIG. 22 is a model diagram showing an initial magnetization state in two ferromagnetic layers of the MR element of the prior art.

Next, with reference to FIG. 19 and FIG. 20, one example of the head stack assembly and the hard disk apparatus in the present embodiment are explained.

FIG. 19 is an explanatory diagram showing a principal part of the hard disk apparatus, and FIG. 20 is a plan view of the hard disk apparatus.

A head stack assembly 350 has a carriage 351 having a plurality of arms 352. A plurality of the HGAs 320 are mounted in the plurality of arms 352 so as to align in the perpendicular direction at intervals with each other. The coil 353 to be a portion of the voice coil motor is mounted at the opposite side of the arm 352. The head stack assembly 350 is integrated into the hard disk apparatus.

The hard disk apparatus has a plurality of pieces of hard disks 362 mounted in a spindle motor 361. Two sliders 310 are arranged so as to opposite from each other interposing the hard disk 362. Further, the voice coil motor has permanent magnets 363 arranged at positions opposing from each other interposing the coil 353 of the head stack assembly 350.

The head stack assembly 350 and the actuator excluding the sliders 310 correspond to a positioning device in the present embodiment, and support the sliders 310 and position with regard to the hard disk 362.

In the hard disk apparatus in the present embodiment, the slider 310 is moved in the track crossing direction of the hard disk 362 by the actuator, and the slider 310 is positioned relative to the hard disk 362. The thin film magnetic head 100 (see FIG. 16) included in the slider 310 records information into the hard disk 362 by the recording head part 101B (see FIG. 16), and reproduces the information recorded in the hard disk 362 by the reproducing head part 101A (see FIG. 16).

The embodiment explained above is described in order to facilitate the understanding of the present invention, and is not described for limiting the present invention. Therefore, each element disclosed in the present embodiment has an effect including all design changes and equivalents belonging to the technical scope of the present invention.

In the embodiment above, the first exchange-coupling functional gap layer 23 is intervened between the first shield layer 3 and the first ferromagnetic layer 21 for indirectly and magnetically coupling both, and, the second exchange-coupling functional gap layer 24 is intervened between the second shield layer 4 and the second ferromagnetic layer 22 for indirectly and magnetically coupling both, but the present invention is not limited to such mode. For example, the first shield layer 3 and the first ferromagnetic layer 21, and, the second shield layer 4 and the second ferromagnetic layer 22 can be directly and magnetically coupled without having the first exchange-coupling functional gap layer 23 and the second exchange-coupling functional gap layer 24 intervened, respectively.

In the embodiment above, as the first exchange-coupling functional gap layer 23 and the second exchange-coupling gap layer 24, ones having a three-layer lamination structure with the exchange-coupling transmitting layers 231 and 241, the gap adjustment layers 232 and 242 and the exchange-coupling adjustment layers 233 and 243 are exemplified as the example (see FIG. 8), but the present invention is not limited to such mode. For example, the first exchange-coupling functional gap layer 23 can be configured by including a first composite layer where the exchange-coupling transmitting layer and the gap adjustment layer are alternately repeatedly laminated, and the exchange-coupling adjustment layer positioned at the lower side of the first composite layer (at the first ferromagnetic layer 21 side). Further, the second exchange-coupling functional gap layer 24 can be configured by including a second composite layer where the exchange-coupling transmitting layer and the gap adjustment layer are alternately repeatedly laminated, and the exchange-coupling adjustment layer positioned at the upper side of the second composite layer (at the second ferromagnetic layer 22 side). In this case, in each of the first composite layer and the second composite layer, the number of repeatedly-laminating one set of the exchange-coupling transmitting layer and the gap adjustment layer can be any integer, which is two or greater. Furthermore, the mode shown in FIG. 9 is one example of a configuration where two layers of the one set of the exchange-coupling transmitting layer and the gap adjustment layer are repeatedly laminated.

In the embodiment above, the composite type thin film magnetic head having the reproducing head part 101A and the recording head part 101B laminated onto the reproducing head 101A was explained as an example, but the present invention is not limited such embodiment. For example, the composite type thin film magnetic head may have the recording head part 101B and the reproducing head part 101A that is laminated on the recording head part 101B, i.e., having the lamination order that is reversed. Further, the MR element 1 relating to the present embodiment is applicable to a thin film head exclusive for reproduction that does not include the recording head part 101B, but includes only the reproducing head part 101A.

EXAMPLES

Hereafter, the present invention is explained in further detail by exemplifying experimental examples, but the present invention is not limited to the experimental examples below at all.

Example 1

Regarding the angle of the magnetizations 21a and 22a of the first ferromagnetic layer 21 and the second ferromagnetic layer 22 in the MR element 1 having the configuration shown in FIG. 2, FIG. 3, FIG. 4A, FIG. 4B and FIG. 5, a simulation analysis experiment (calculation of convergent magnetization state by LLG simulation) was conducted. Furthermore, in the MR element 1 used in the simulation analysis experiment, the angle of each exchange-coupling magnetic field (Hua) with regard to the ABS was set at 45 degrees so as to orthogonalize the directions of the exchange-coupling magnetic fields (Hua) of the first antiferromagnetic layer 5 and the second antiferromagnetic layer 6. Further, the dimensions of the MR element 1 are shown in Table 1, and intensity (erg/$cm^2$) of exchange coupling in between each layer in the MR element 1 is shown in Table 2.

TABLE 1

| Lamination structure | | Width (X direction dimension, nm) | Length (Y direction dimension, nm) | Thickness (Z direction dimension, nm) |
|---|---|---|---|---|
| First antiferromagnetic layer (5) | | 480 | 400 | 5 |
| First shield layer (31) | | 480 | 400 | 12.5 |
| First shield layer (32) | | 480 | 400 | 12.5 |
| MR part (2) | First exchange-coupling functional gap layer (23) | 35 | 35 | 0.8 |
| | First ferromagnetic layer (21) | 35 | 35 | 5 |
| | Nonmagnetic intermediate layer (20) | 35 | 35 | 1 |
| | Second ferromagnetic layer (22) | 35 | 35 | 5 |
| | Second exchange-coupling functional gap layer (24) | 35 | 35 | 0.8 |
| Second shield layer (41) | | 480 | 400 | 12.5 |
| Second shield layer (42) | | 480 | 400 | 12.5 |
| Second antiferromagnetic layer (6) | | 480 | 400 | 10 |
| Magnetization direction adjustment layer (8) | | 35 | 365 | 11 |

TABLE 2

| | Exchange-coupling intensity (erg/cm$^2$) |
|---|---|
| First antiferrmagnetic layer (5)-First shield layer (31) | 0.5 |
| First shield layer (31)-First shield layer (32) | −0.8 |
| First shield layer (32)-First ferromagnetic layer (21) | −0.2 |
| Second ferromagnetic layer (22)-Second shield layer (41) | −0.2 |
| Second shield layer (41)-Second shield layer (42) | −0.8 |
| Second shield layer (42)-Second antiferromagnetic layer (6) | 0.5 |

As a result of this simulation analysis experiment, in the MR element 1 of Example 1, the angle $\theta_{01}$ formed by the magnetizations 21a and 22a of the first ferromagnetic layer 21 and the second ferromagnetic layer 22 (see FIG. 12A) was 86 degrees.

Example 2

Regarding the angle of the magnetizations 21a and 22a of the first ferromagnetic layer 21 and the second ferromagnetic layer 22 in the MR element 1 having the configuration shown in FIG. 2, FIG. 3, FIG. 4A, FIG. 4B and FIG. 6, a simulation analysis experiment (calculation of convergent magnetization state by LLG simulation) was conducted. Furthermore, in the MR element 1 used in the simulation analysis experiment, the angle of each exchange-coupling magnetic field (Hua) with regard to the ABS was set at 45 degrees so as to orthogonalize the directions of the exchange-coupling magnetic fields (Hua) of the first antiferromagnetic layer 5 and the second antiferromagnetic layer 6. Further, dimensions of the MR element 1 are shown in Table 3, and intensity (erg/cm$^2$) of exchange coupling in between each layer in the MR element 1 is shown in Table 4.

TABLE 3

| Lamination structure | | Width (X direction dimension, nm) | Length (Y direction dimension, nm) | Thickness (Z direction dimension, nm) |
|---|---|---|---|---|
| First antiferromagnetic layer (5) | | 480 | 400 | 5 |
| First shield layer (31) | | 480 | 400 | 12.5 |
| First shield layer (32) | | 480 | 400 | 12.5 |
| MR part (2) | First exchange-coupling functional gap layer (23) | 35 | 35 | 0.8 |
| | First ferromagnetic layer (21) | 35 | 35 | 5 |
| | Nonmagnetic intermediate layer (20) | 35 | 35 | 1 |
| | Second ferromagnetic layer (22) | 35 | 35 | 5 |
| | Second | 35 | 35 | |

TABLE 3-continued

| Lamination structure | | Width (X direction dimension, nm) | Length (Y direction dimension, nm) | Thickness (Z direction dimension, nm) |
|---|---|---|---|---|
| | exchange-coupling functional gap layer (24) | | | 0.8 |
| Second shield layer (41) | | 480 | 400 | 12.5 |
| Second shield layer (42) | | 480 | 400 | 12.5 |
| Second antiferromagnetic layer (6) | | 480 | 400 | 10 |
| Magnetization direction adjustment layer (8) | First magnetization adjtment layer (81) | 35 | 365 | 5 |
| | Insulating layer (95) | 35 | 365 | 1 |
| | Second magnetization adjustment layer (82) | 35 | 365 | 5 |
| Exchange-coupling layer (96) | | 35 | 365 | 0.8 |
| Exchange-coupling layer (97) | | 35 | 365 | 0.8 |

TABLE 4

| | Exchange-coupling intensity (erg/cm$^2$) |
|---|---|
| First antiferromagnetic layer (5)-First shield layer (31) | 0.5 |
| First shield layer (31)-First shield layer (32) | −0.8 |
| First shield layer (32)-First ferromagnetic layer (21) | −0.2 |
| Second ferromagnetic layer (22)-Second shield layer (41) | −0.2 |
| Second shield layer (41)-Second shield layer (42) | −0.8 |
| Second shield layer (42)-Second antiferromagnetic layer (6) | 0.5 |
| First shield layer (32)-First magnetization direction adjustment layer (81) | −0.2 |
| Second shield layer (41)-Second magnetization direction adjustment layer (82) | −0.2 |

As a result of this simulation analysis experiment, in the MR element 1 of Example 2, the angle $\theta_{01}$ formed by the magnetizations 21*a* and 22*a* of the first ferromagnetic layer 21 and the second ferromagnetic layer 22 (see FIG. 12A) was 96 degrees.

Comparative Example 1

Regarding the angle of the magnetizations of the first ferromagnetic layer 21 and the second ferromagnetic layer 22 in the MR element 1 having the configuration similar to Example 1 except for not having the magnetization direction adjustment layer 8, a simulation analysis experiment (calculation of convergent magnetization state by LLG simulation) was conducted as similar to Example 1.

As a result of this simulation analysis experiment, in the MR element of Comparative Example 1, the angle formed by the magnetizations of the first ferromagnetic layer and the second ferromagnetic layer was 138 degrees.

According to the result of these simulation experiments, as in the magnetoresistive effect element 1 of Example 1, because of including the magnetization direction adjustment layer 8 rearward (at the depth side of) the MR part 2 viewing from the ABS side, since the antiferromagnetic coupling magnetic field acting on between the first ferromagnetic layer 21 and the second ferromagnetic layer 22 is absorbed by the magnetization direction adjustment layer 8, it was ascertained that the magnetizations 21*a* and 22*a* of the first ferromagnetic layer 21 and the second ferromagnetic layer 22 can be maintained to be substantially orthogonalized with each other.

Further, as in the MR element 1 of Example 2, because the first magnetization direction adjustment layer 81 included rearward (at the depth side of) the MR part 2 is magnetically coupled with the first shield layer 3 and the first magnetization direction adjustment layer 82 is magnetically coupled with the second shield layer 4, since an assist magnetic field from the first magnetization direction adjustment layer 81 and the second magnetization direction adjustment layer 82 is applied to the first ferromagnetic layer 21 and the second ferromagnetic layer 22, respectively, it was ascertained that the magnetizations 21*a* and 22*a* of the first ferromagnetic layer 21 and the second ferromagnetic layer 22 can be maintained to be substantially orthogonalized with each other.

Therefore, according to the MR element 1 having such configuration, the reproducing output can be improved and asymmetry of the signal waveform can be decreased, and sensitivity (reader performance) to an external magnetic field to be detected can be improved.

The present invention is utilizable for an industry of the magnetic disk apparatus including an MR element for reading intensity of a magnetic field of a magnetic recording medium as a signal.

What is claimed is:

1. A magnetoresistive effect element (MR element) with a current-perpendicular-to-plane (CPP) structure, comprising
    a magnetoresistive effect part (MR part), and
    a first shield layer and a second shield layer that are formed by lamination so as to interpose the MR part, and in which a sense current is applied in the lamination direction, wherein
    the MR part comprises a nonmagnetic intermediate layer, and a first ferromagnetic layer and a second ferromagnetic layer formed by lamination so as to interpose the nonmagnetic intermediate layer from upper and lower sides;
    the first shield layer and the second shield layer respectively have an inclining magnetization structure of which a magnetization is inclined with regard to a track width direction;
    the first ferromagnetic layer is directly or indirectly and magnetically coupled with the first shield layer;
    the second ferromagnetic layer is directly or indirectly and magnetically coupled with the second shield layer;
    a magnetization direction adjustment layer composed of a magnetic body for adjusting magnetization directions of the first ferromagnetic layer and the second ferromagnetic layer is positioned at rear end surface sides of the first ferromagnetic layer and the second ferromagnetic layer, the rear end surface side is an opposite side of a front end surface receiving a magnetic field to be detected in the MR part;
    the magnetization direction adjustment layer has a first magnetization direction adjustment layer positioned at the rear end surface side of the first ferromagnetic layer and a second magnetization direction adjustment layer positioned at the rear end surface side of the second ferromagnetic layer; and an insulating layer is positioned between the first magnetization direction adjustment layer and the second magnetization direction adjustment layer.

2. The MR element according to claim 1, wherein
the first magnetization direction adjustment layer is magnetically coupled with the first shield layer, and the second magnetization direction adjustment layer is magnetically coupled with the second shield layer.

3. The MR element according to claim 2, wherein
between the first magnetization direction adjustment layer and the first shield layer and/or between the second magnetization direction adjustment layer and the second shield layer, a coupling layer that magnetically couples these layers is positioned.

4. The MR element according to claim 1, wherein
an insulating layer is positioned between the magnetization direction adjustment layer and the rear end surface side of the MR part.

5. The MR element according to claim 1, wherein
between the first ferromagnetic layer and the first shield layer, a first exchange-coupling functional gap layer for indirectly and magnetically coupling these layers is positioned; and between the second ferromagnetic layer and the second shield layer, a second exchange-coupling functional gap layer for indirectly and magnetically coupling these layer is positioned.

6. The MR element according to claim 5, wherein
the first exchange-coupling functional gap layer includes an exchange-coupling transmitting layer, a gap adjustment layer and an exchange-coupling adjustment layer sequentially from the first shield layer side; and the second exchange-coupling functional gap layer includes an exchange-coupling transmitting layer, a gap adjustment layer and an exchange-coupling adjustment layer sequentially from the second shield layer side.

7. The MR element according to claim 5, wherein
the first exchange-coupling functional gap layer includes a first composite layer in which an exchange-coupling transmitting layer and a gap adjustment layer are alternately repeatedly laminated, and an exchange-coupling adjustment layer that is positioned at the first ferromagnetic layer side; and the second exchange-coupling functional gap layer includes a second composite layer in which an exchange-coupling transmitting layer and a gap adjustment layer are alternately repeatedly laminated, and an exchange-coupling adjustment layer that is positioned at the second ferromagnetic layer side.

8. The MR element according to claim 1, further comprising:
a first antiferromagnetic layer adjacent to the first shield layer; and
a second antiferromagnetic layer adjacent to the second shield layer, wherein
the first shield layer, the MR part and the second shield layer are interposed by the first antiferromagnetic layer and the second antiferromagnetic layer from upper and lower sides;
a blocking temperature of an antiferromagnetic material composing the second antiferromagnetic layer is higher than that of an antiferromagnetic material composing the first antiferromagnetic layer.

9. The MR element according to claim 1, wherein
the MR element does not have a hard magnetic body or a magnet for applying a bias magnetic field to the first ferromagnetic layer and the second ferromagnetic layer.

10. A thin film magnetic head, comprising:
an air bearing surface (ABS) opposing to a recording medium; and
the MR element according to claim 1 arranged in the vicinity of the ABS for detecting a signal magnetic field from the recording medium.

11. A head gimbal assembly (HGA), comprising:
a slider including the thin film magnetic head according to claim 10, and arranged opposing to a recording medium; and
a suspension that elastically supports the slider.

12. A magnetic disk apparatus, comprising:
a slider including the thin film magnetic head according to claim 10, and arranged opposing to a recording medium; and
a positioning device that supports and positions the slider with regard to the recording medium.

13. A magnetoresistive effect element (MR element) with a current-perpendicular-to-plane (CPP) structure, comprising
a magnetoresistive effect part (MR part), and
a first shield layer and a second shield layer that are formed by lamination so as to interpose the MR part, and in which a sense current is applied in the lamination direction, wherein
the MR part comprises a nonmagnetic intermediate layer, and a first ferromagnetic layer and a second ferromagnetic layer formed by lamination so as to interpose the nonmagnetic intermediate layer from upper and lower sides;
the first shield layer and the second shield layer respectively have an inclining magnetization structure of which a magnetization is inclined with regard to a track width direction;
the first ferromagnetic layer is directly or indirectly and magnetically coupled with the first shield layer;
the second ferromagnetic layer is directly or indirectly and magnetically coupled with the second shield layer;
a magnetization direction adjustment layer composed of a magnetic body for adjusting at least a magnetization direction of the first ferromagnetic layer is positioned at a rear end surface side of the first ferromagnetic layer, the rear end surface side is an opposite side of a front end surface receiving a magnetic field to be detected in the MR part; and
the magnetization direction adjustment layer is coupled with the first shield layer and/or the second shield layer.

14. The MR element according to claim 13, wherein
between the first magnetization direction adjustment layer and the first shield layer and/or the second shield layer, a coupling layer that magnetically couples these layers is positioned.

15. The MR element according to claim 13, wherein
between the first ferromagnetic layer and the first shield layer, a first exchange-coupling functional gap layer for indirectly and magnetically coupling these layers is positioned;
between the second ferromagnetic layer and the second shield layer, a second exchange-coupling functional gap layer for indirectly and magnetically coupling these layer is positioned;
the first exchange-coupling functional gap layer includes a first composite layer in which an exchange-coupling transmitting layer and a gap adjustment layer are alternately repeatedly laminated, and an exchange-coupling adjustment layer that is positioned at the first ferromagnetic layer side; and the second exchange-coupling functional gap layer includes a second composite layer in which an exchange-coupling transmitting layer and a gap adjustment layer are alternately repeatedly laminated, and an exchange-coupling adjustment layer that is positioned at the second ferromagnetic layer side.

16. The MR element according to claim 13, further comprising:

a first antiferromagnetic layer adjacent to the first shield layer; and a second antiferromagnetic layer adjacent to the second shield layer, wherein the first shield layer, the MR part and the second shield layer are interposed by the first antiferromagnetic layer and the second antiferromagnetic layer from upper and lower sides;

a blocking temperature of an antiferromagnetic material composing the second antiferromagnetic layer is higher than that of an antiferromagnetic material composing the first antiferromagnetic layer.

17. The MR element according to claim 13, wherein the MR element does not have a hard magnetic body or a magnet for applying a bias magnetic field to the first ferromagnetic layer and the second ferromagnetic layer.

18. A magnetoresistive effect element (MR element) with a current-perpendicular-to-plane (CPP) structure, comprising a magnetoresistive effect part (MR part), and a first shield layer and a second shield layer that are formed by lamination so as to interpose the MR part, and in which a sense current is applied in the lamination direction, wherein the MR part comprises a nonmagnetic intermediate layer, and a first ferromagnetic layer and a second ferromagnetic layer formed by lamination so as to interpose the nonmagnetic intermediate layer from upper and lower sides;

the first shield layer and the second shield layer respectively have an inclining magnetization structure of which a magnetization is inclined with regard to a track width direction;

the first ferromagnetic layer is directly or indirectly and magnetically coupled with the first shield layer;

the second ferromagnetic layer is directly or indirectly and magnetically coupled with the second shield layer;

a magnetization direction adjustment layer composed of a magnetic body for adjusting at least a magnetization direction of the first ferromagnetic layer is positioned at a rear end surface side of the first ferromagnetic layer, the rear end surface side is an opposite side of a front end surface receiving a magnetic field to be detected in the MR part; and the MR element does not have a hard magnetic body or a magnet for applying a bias magnetic field to the first ferromagnetic layer and the second ferromagnetic layer.

19. The MR element according to claim 18, further comprising:

a first antiferromagnetic layer adjacent to the first shield layer; and a second antiferromagnetic layer adjacent to the second shield layer, wherein the first shield layer, the MR part and the second shield layer are interposed by the first antiferromagnetic layer and the second antiferromagnetic layer from upper and lower sides;

a blocking temperature of an antiferromagnetic material composing the second antiferromagnetic layer is higher than that of an antiferromagnetic material composing the first antiferromagnetic layer.

20. The MR element according to claim 18, wherein between the first ferromagnetic layer and the first shield layer, a first exchange-coupling functional gap layer for indirectly and magnetically coupling these layers is positioned;

between the second ferromagnetic layer and the second shield layer, a second exchange-coupling functional gap layer for indirectly and magnetically coupling these layer is positioned;

the first exchange-coupling functional gap layer includes a first composite layer in which an exchange-coupling transmitting layer and a gap adjustment layer are alternately repeatedly laminated, and an exchange-coupling adjustment layer that is positioned at the first ferromagnetic layer side; and the second exchange-coupling functional gap layer includes a second composite layer in which an exchange-coupling transmitting layer and a gap adjustment layer are alternately repeatedly laminated, and an exchange-coupling adjustment layer that is positioned at the second ferromagnetic layer side.

* * * * *